(12) United States Patent
Huber

(10) Patent No.: US 11,482,766 B2
(45) Date of Patent: Oct. 25, 2022

(54) INTERCONNECTION INCLUDING A HYBRID CABLE ASSEMBLY AND A CIRCUIT BOARD ASSEMBLY

(71) Applicant: MD ELEKTRONIK GmbH, Waldkraiburg (DE)

(72) Inventor: Martin Huber, Obing (DE)

(73) Assignee: MD ELEKTRONIK GMBH, Waldkraiburg (DE)

( * ) Notice: Subject to any disclaimer, the term of this patent is extended or adjusted under 35 U.S.C. 154(b) by 258 days.

(21) Appl. No.: 16/905,939

(22) Filed: Jun. 19, 2020

(65) Prior Publication Data
US 2021/0013578 A1    Jan. 14, 2021

(30) Foreign Application Priority Data

Jul. 10, 2019   (DE) .................... 10 2019 118 733.8

(51) Int. Cl.
*H05K 1/02* (2006.01)
*H01P 5/08* (2006.01)
(Continued)

(52) U.S. Cl.
CPC ............... *H01P 5/087* (2013.01); *H01P 3/16* (2013.01); *H01R 12/53* (2013.01); *H05K 1/0243* (2013.01);
(Continued)

(58) Field of Classification Search
CPC ......... H01P 5/087; H01P 3/16; H05K 1/0243; H05K 2201/037; H05K 2201/0919;
(Continued)

(56) References Cited

U.S. PATENT DOCUMENTS 6,980,068 B2 *  12/2005  Miyazawa .............. H01P 1/047
                                                                   333/260
8,909,294 B2    12/2014  Keevill et al.
(Continued)

FOREIGN PATENT DOCUMENTS

DE       202005021930 U1    8/2011
EP              3435482 A1    1/2019

*Primary Examiner* — Steven T Sawyer
(74) *Attorney, Agent, or Firm* — Leydig, Voit & Mayer, Ltd.

(57) ABSTRACT

An interconnection includes a circuit board assembly and a hybrid cable assembly. The circuit board assembly includes first and second outer layer assemblies and an intermediate layer assembly. The first and second outer layer assemblies each include an electrically conductive layer. A cable-receiving space is formed at a first side edge of the circuit board assembly. The hybrid cable assembly includes a dielectric waveguide system having a core and a cladding and being configured to transmit a radar wave in a frequency range from about 70 to about 300 GHz. A first conductor system configured to transmit power and/or data is disposed adjacent to the dielectric waveguide system and includes an electrically conductive inner conductor assembly inserted into the cable-receiving space and galvanically connected to a first inner-conductor connection region. The core of the dielectric waveguide system is inserted into the cable-receiving space and disposed at a waveguide connection region.

14 Claims, 17 Drawing Sheets

(51) Int. Cl.
*H01P 3/16* (2006.01)
*H01R 12/53* (2011.01)

(52) U.S. Cl.
CPC .............. *H05K 2201/037* (2013.01); *H05K 2201/0919* (2013.01); *H05K 2201/10265* (2013.01); *H05K 2201/10356* (2013.01)

(58) Field of Classification Search
CPC ......... H05K 1/183; H05K 2201/09036; H05K 2201/10356; H01R 12/53; H01R 4/02; H01R 43/0256
See application file for complete search history.

(56) References Cited

U.S. PATENT DOCUMENTS

| | | | |
|---|---|---|---|
| 8,941,013 B2 * | 1/2015 | Arnold | H05K 1/117 |
| | | | 174/258 |
| 10,541,479 B2 | 1/2020 | Huber et al. | |
| 2006/0281343 A1 * | 12/2006 | Uchida | H05K 3/363 |
| | | | 439/67 |
| 2006/0286858 A1 * | 12/2006 | Uchida | H01R 12/79 |
| | | | 439/495 |
| 2015/0295305 A1 | 10/2015 | Herbsommer et al. | |
| 2016/0006101 A1 * | 1/2016 | Payne | H01P 5/087 |
| | | | 385/101 |
| 2016/0072173 A1 | 3/2016 | Herbsommer et al. | |
| 2018/0191061 A1 | 7/2018 | Sundaram et al. | |
| 2019/0036245 A1 * | 1/2019 | Huber | H05K 3/34 |
| 2019/0081376 A1 * | 3/2019 | Takeda | H01P 3/14 |

* cited by examiner

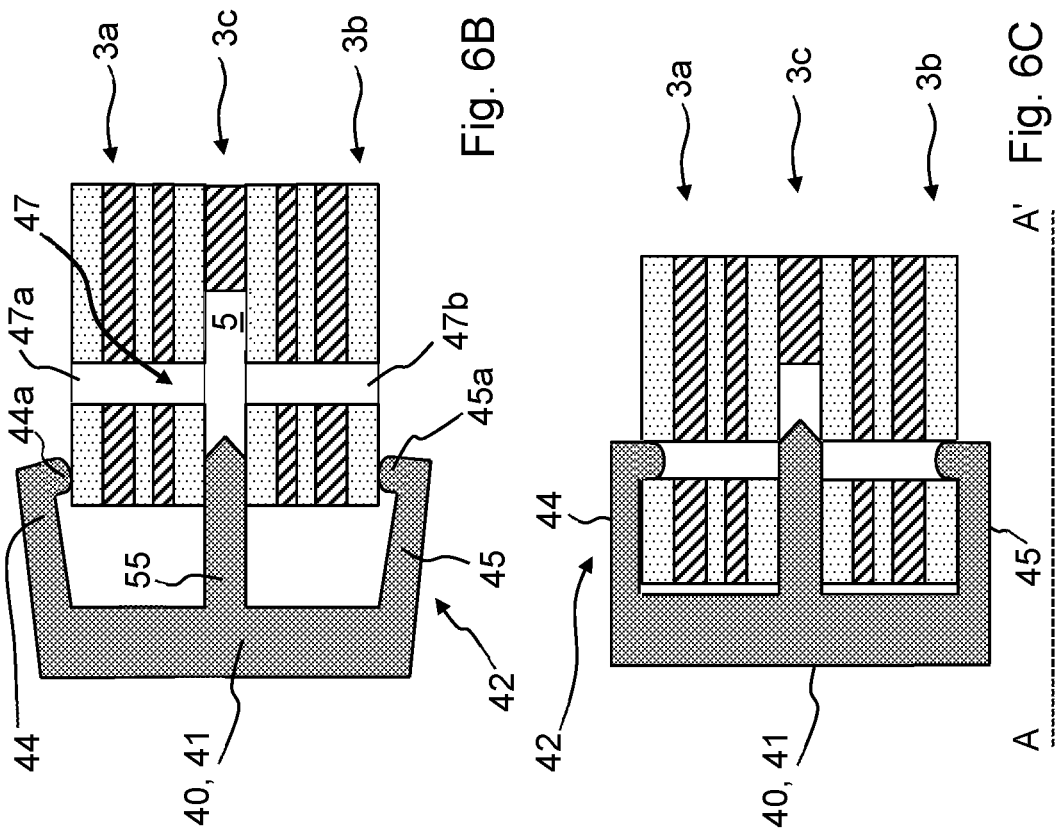
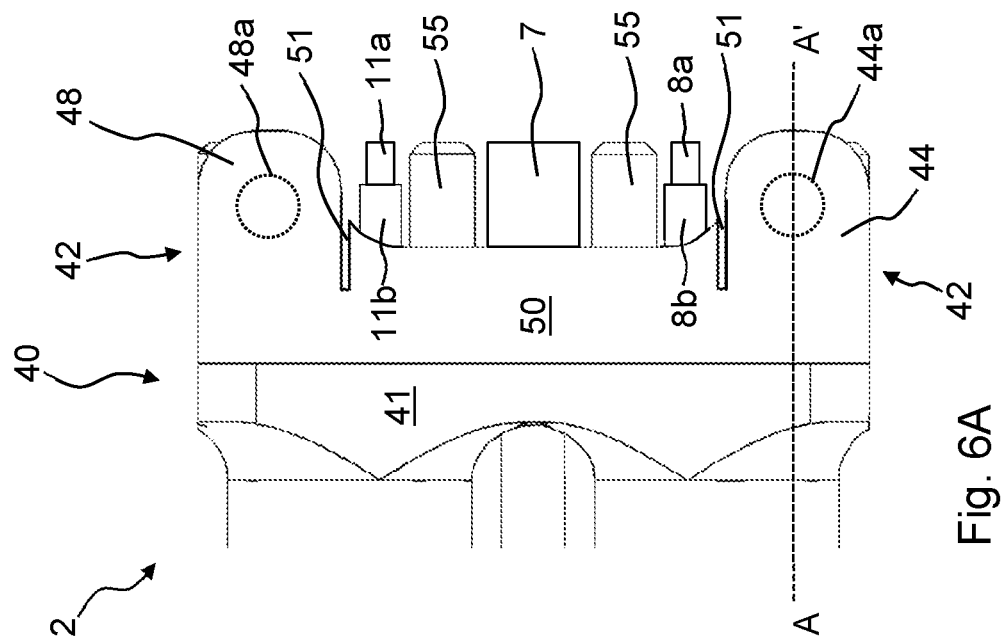

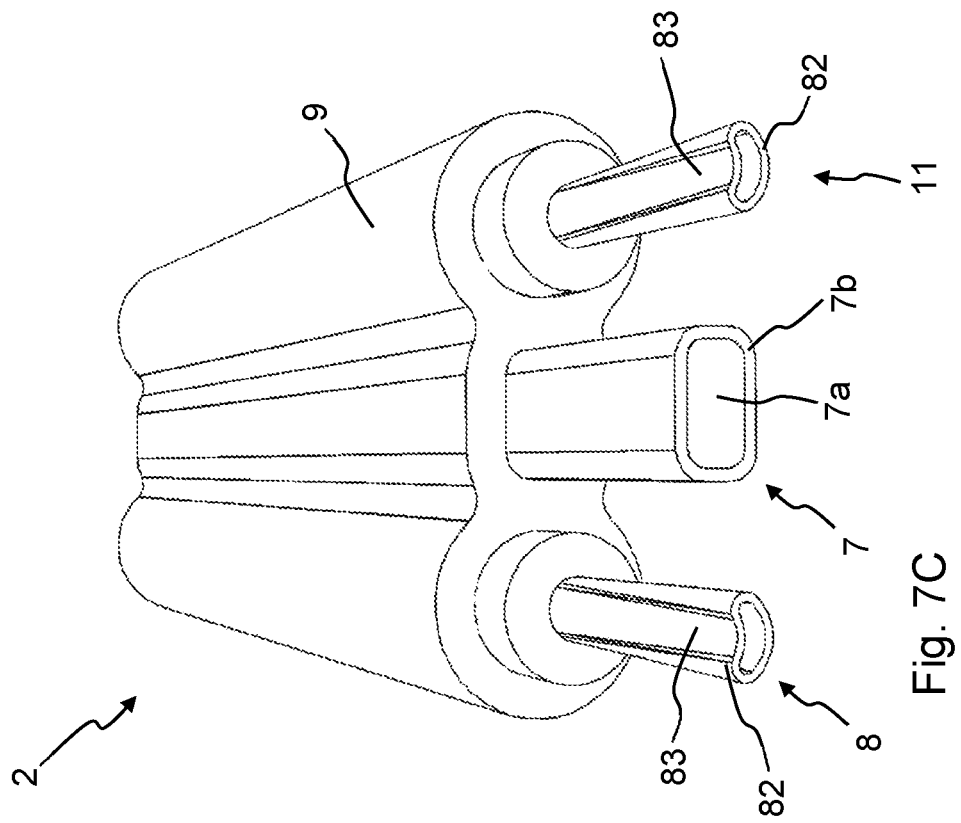
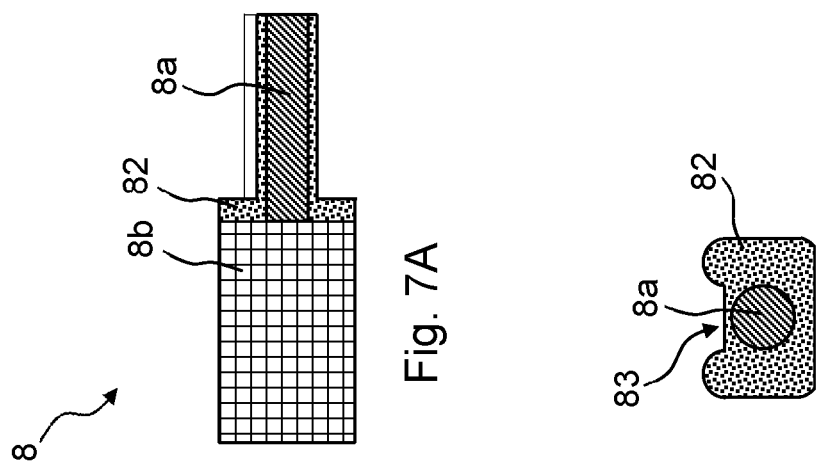
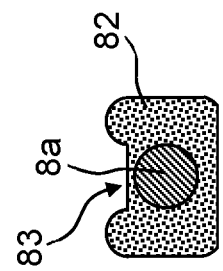

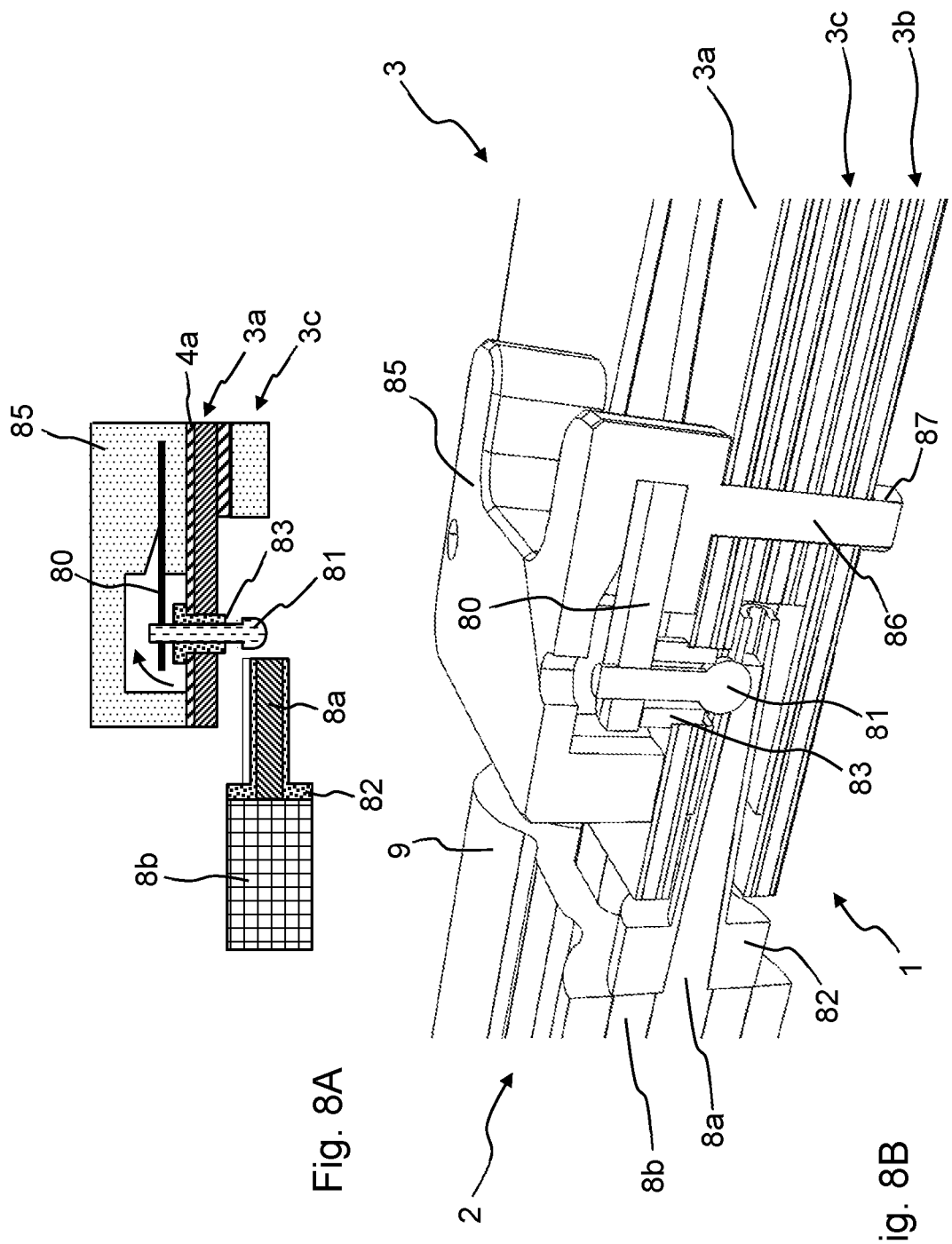

INTERCONNECTION INCLUDING A HYBRID CABLE ASSEMBLY AND A CIRCUIT BOARD ASSEMBLY

CROSS-REFERENCE TO PRIOR APPLICATION

Priority is claimed to German Patent Application No. DE 10 2019 118 733.8, filed on Jul. 10, 2019, the entire disclosure of which is hereby incorporated by reference herein.

FIELD

The invention relates to an interconnection including a hybrid cable assembly and a circuit board assembly.

BACKGROUND

There is a desire to transfer data at increasingly higher data transfer rates. Today, very high data rates are produced, for example, by sensors which are installed in vehicles to sense the vehicle environment. These data are fed to driver assistance systems, some of which can intervene in the vehicle control and, in certain situations, may even take over the vehicle control (e.g., emergency brake assist system). In the future, even higher data rates will be required, especially in connection with the desire for autonomous driving. To achieve such data rates, suitable cables are needed.

DE 20 2005 021 930 U1 describes a preconnectorized cable assembly. The cable assembly includes a cable having a tensile element and an optical waveguide and a cable jacket, the cable jacket surrounding the tensile element and the optical waveguide. There is also a plug connector mounted upon one end of the cable. The plug connector includes a housing having a longitudinal passageway for passing the optical waveguide therethrough. The housing has at least two shells, and the tensile element is secured to the housing.

US 2015/0295305 A1 describes the feeding of a waveguide. For this purpose, a transceiver circuitry is provided which is operable to produce and/or receive a radio frequency (RF) signal. An antenna structure is coupled to the transceiver circuitry via bond wires. Mold material encapsulates the transceiver circuitry and the antenna structure, the antenna structure being positioned so as to be aligned in the direction of a core of a dielectric waveguide positioned adjacent the encapsulated transceiver circuitry.

US 2018/0191061 A1 describes the design of a multi-layer printed circuit board assembly. This multi-layer printed circuit board assembly is provided at its center with an opening through which an electromagnetic wave can be transmitted to a respective cable to be attached.

US 2016/0072173 A1 and US 2016/0006101 A1 describe a connection between two control units disposed in a housing. The control units are interconnected for data transmission via a cable. This cable includes a dielectric waveguide. The cable also includes electrical conductors. In order to ensure backward compatibility, the plug-and-socket connection must have the dimensions of an RJ-11 connector.

US 2016/006101 A1 has the disadvantage that a relatively large space is needed to integrate the interconnections.

SUMMARY

In an embodiment, the present invention provides an interconnection including a circuit board assembly and a hybrid cable assembly. The circuit board assembly includes a first outer layer assembly, a second outer layer assembly, and an intermediate layer assembly which are stacked on top of each other, the intermediate layer assembly being disposed between the first outer layer assembly and the second outer layer assembly. The first outer layer assembly includes at least one layer that is electrically conductive. The second outer layer assembly includes at least one layer that is electrically conductive. The circuit board assembly includes a first hollow between the first outer layer assembly and the second outer layer assembly, whereby a cable-receiving space is formed at a first side edge of the circuit board assembly. The hybrid cable assembly includes at least one dielectric waveguide system configured to transmit a radar wave in a frequency range from about 70 to about 300 GHz. The at least one dielectric waveguide system has a core and a cladding, the cladding surrounding the core. The hybrid cable assembly includes a first conductor system configured to transmit power and/or data. The first conductor system is disposed adjacent to the at least one dielectric waveguide system. The first conductor system includes an electrically conductive inner conductor assembly surrounded by a sheath. The electrically conductive inner conductor assembly is inserted at the first side edge into the cable-receiving space and galvanically connected to a first inner-conductor connection region of the circuit board assembly. At least the core of the at least one dielectric waveguide system is inserted at the first side edge into the cable-receiving space and disposed at a waveguide connection region of the circuit board assembly.

BRIEF DESCRIPTION OF THE DRAWINGS

Embodiments of the present invention will be described in even greater detail below based on the exemplary figures. The present invention is not limited to the exemplary embodiments. All features described and/or illustrated herein can be used alone or combined in different combinations in embodiments of the present invention. The features and advantages of various embodiments of the present invention will become apparent by reading the following detailed description with reference to the attached drawings which illustrate the following:

FIGS. 6A, 6B, 6C, 6D, 6E are different views illustrating in greater detail the attachment of the cable to the circuit board assembly;

FIGS. 7A, 7B, 7C, 7D, 7E are different views illustrating in greater detail the electrical contacting of the hybrid cable assembly to the circuit board assembly;

FIGS. 8A, 8B, 8C are different views illustrating in greater detail the electrical contacting of the hybrid cable assembly to the circuit board assembly.

DETAILED DESCRIPTION

Figure 1:
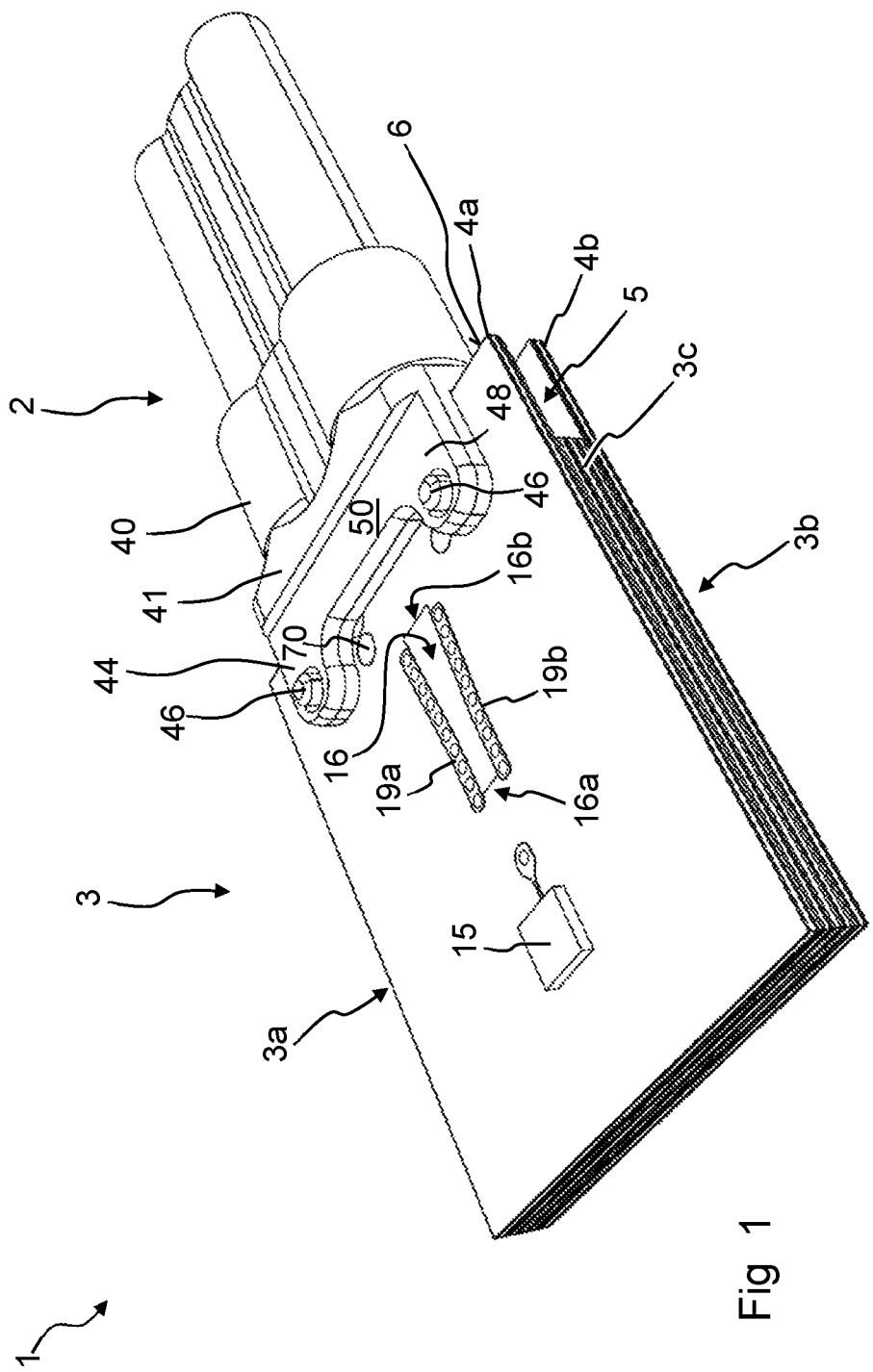
FIG. 1 shows an exemplary embodiment of the interconnection according to the invention.

In an embodiment, the present invention provides an interconnection that is very compact in design and yet allows for very high data rates.

The interconnection according to an embodiment of the present invention includes a hybrid cable assembly and a circuit board assembly. The circuit board assembly has a first and a second outer layer assembly and an intermediate layer assembly which are stacked on top of each other and, in particular, are glued and/or pressed together. The first and/or second outer layer assembly includes at least one layer that is electrically conductive. The hybrid cable assembly includes a dielectric waveguide system to allow transmission of a radar wave in the frequency range from above about 70 GHz to no more than about 300 GHz, in particular from about 80 GHz to about 150 GHz. Thus, a dielectric waveguide system is not intended for transmission of electromagnetic radiation in the IR to UV range (which is sometimes referred to as "radar" waves in some documents of the literature). The dielectric waveguide system includes a core and a cladding, both of which extend in the longitudinal direction, with the cladding surrounding the core. In the above-mentioned frequency range from 70 to 300 GHz, in particular from 80 to 150 GHz, the core and the cladding have distinctly different dielectric constants, so that the electromagnetic radiation is totally reflected at the interface between the core and the surrounding cladding, whereby the electromagnetic radiation is confined to the core and propagates substantially in the direction of extent of the core. In particular, it is provided that the core and the cladding include different materials having greatly differing dielectric constants. Alternatively, it may be provided that the core and the cladding be made of the same chemical material, with the difference, however, of the core containing the material in a compact form and the cladding containing the material in a foamed form, for example. For this alternative, it may be provided, in particular, that the core be made a plastic in massive, compact and dense form, and that the cladding surrounding this plastic be in porous, e.g., foamed form. The hybrid cable assembly further includes a first conductor system through which power and/or data can be transmitted. The first conductor system is arranged to extend adjacent the dielectric waveguide system substantially along the direction of extent of the dielectric waveguide system, in particular parallel to the dielectric waveguide system, or such that it helically surrounds the dielectric waveguide system. The first conductor system includes an electrically conductive inner conductor assembly surrounded by an electrically insulating sheath. The circuit board assembly includes a first hollow between the first and second outer layer assemblies, which hollow forms a cable-receiving space. The cable-receiving space is formed at a first side edge of the circuit board assembly and is accessible from outside of the circuit board assembly. The electrically conductive inner conductor assembly is inserted at the first side edge into the cable-receiving space and galvanically connected to a first inner-conductor connection region of the circuit board assembly. At least the core and in particular also the cladding of the at least one dielectric waveguide system are also inserted at the first side edge into the cable-receiving space and are disposed at or coupled to a waveguide connection region of the circuit board assembly.

It is particularly advantageous that the inventive interconnection is very compact in design. This makes it possible to receive a hybrid cable that allows transmission of both electromagnetic signals (via the dielectric waveguide system) and electrical signals (via the first conductor system). By forming the hollow into the circuit board assembly itself, a very flat design is made possible, which allows the interconnection to be used even in confined spaces, such as, for example, in motor vehicles.

The circuit board assembly preferably includes a resonant cavity in the shape of a horn. To this end, a second receiving space is provided in the circuit board assembly. A radiating surface is disposed at the first end of the second receiving space and connected to a computer chip. The second end of the second receiving space is connected to the cable-receiving space via a passageway, thereby forming the waveguide connection region. The computer chip itself is also disposed within the circuit board assembly, which makes the entire design even more compact.

Preferably, the computer chip is integrated into the circuit board assembly without a housing. Therefore, a portion of the computer chip that carries the electrical components (the die) can be placed directly on a corresponding layer (of the intermediate layer assembly) of the circuit board assembly, the connection of the computer chip being provided by bond wires. A terminal of the computer chip is connected via these bond wires to a contacting surface, which, in turn, is galvanically connected to the radiating surface.

In a preferred embodiment, the electrically conductive inner conductor assembly of the first conductor system is electrically conductively attached, in particular, for example, soldered, to the first inner-conductor connection region of the circuit board assembly. For this purpose, the first and/or second outer layer assembly includes a first inner-conductor contact opening, into which a suitable fastening means, in particular a solder, is introduced. Especially in the case of solder, the respective first and/or second outer layer assembly is galvanically connected to the electrically conductive inner conductor assembly by heating. This galvanic connection is implemented in particular via the electrically conductive layer of the first and/or second outer layer assembly. The region in which the solder, or, more generally, the fastening means, contacts the respective outer layer assembly is also referred to as inner-conductor connection region. The solder could also be applied to the electrically conductive inner conductor assembly. Similarly, another fastening means could also be applied to the electrically conductive inner conductor assembly.

Alternatively, the contacting may be effected in a detachable manner. In this case, the hybrid cable assembly and the circuit board assembly can be separated from each other. For this purpose, the circuit board assembly includes a housing assembly having at least one spring element that ensures that a force is permanently applied to an electrical contact. The housing assembly rests on the first or second outer layer assembly. The spring element has an electrically conductive contacting projection which enters through an opening in the first or second outer layer assembly into the cable-receiving space. In a rest position; i.e., before the electrically conductive inner conductor assembly is inserted into the cable-receiving space, the contacting projection is not in electrical contact with the inner conductor assembly (the contacting projection is out of contact, leaving a clearance from the inner conductor assembly). When the electrically conductive inner conductor assembly is inserted; i.e., in a contacting position, the contacting projection comes into galvanic contact with the inner conductor assembly. The spring element is thereby deflected and bent away from the electrically conductive inner conductor assembly of the first conductor system. The contacting projection presses against the inner conductor assembly with the spring force of the spring element, thus enabling a reproducible and permanent electrical contact. The electrical connection of the inner conductor assembly to the circuit board assembly is then made via the electrically conductive contacting projection. For this purpose, the spring element may, for example, be formed as a single piece with the contacting projection so that the contacting projection is a portion of the spring element, the spring element being electrically conductive at least in the region of the contacting projection, but in particular completely. The contacting projection could be formed in the spring element by deep stamping, one end of the spring element being galvanically connected to a corresponding conductive layer of the intermediate layer assembly (e.g. via an ultrasonic weld).

Alternatively, the contacting projection and the spring element may also be formed in two pieces. For example, the contacting projection, in particular in the form of a contacting pin, could be fixed in, in particular pressed into, an opening of the spring element, or pressed and/or welded together with the spring element. Additionally or alternatively, it would also be possible to use a sleeve which has a continuous opening extending therethrough and is inserted, in particular pressed, into the opening of the first or second outer layer assembly. The contacting pin is disposed in this sleeve and is preferably reciprocable therein. If the contacting pin is pushed further into the sleeve, it is pushed out of the other end. The sleeve, the contacting pin and the spring element, which is provided separately from the sleeve and the contacting pin, could also be joined, for example, pressed and/or welded together, to form a prefabricated unit. In this case, movement of the contacting pin causes the sleeve to move partially out of the opening as well, thereby deflecting the spring element.

According to FIG. 1, the inventive interconnection 1 includes a hybrid cable assembly 2 and a circuit board assembly 3. Circuit board assembly 3 includes a first outer layer assembly 3a, a second outer layer assembly 3b, and an intermediate layer assembly 3c disposed between the first and second outer layer assemblies 3a, 3b. First outer layer assembly 3a includes at least one layer 4a that is electrically conductive. Likewise, second outer layer assembly 3b includes a layer 4b that is electrically conductive. Intermediate layer assembly 3c optionally includes a portion that is made of a dielectric material. The term "layer assembly" is understood to refer to a part of a circuit board that may include one or more layers. Conductive layer 4a, 4b is not necessarily the outermost layer.

Circuit board assembly 3 includes a first hollow 5 between first and second outer layer assemblies 3a, 3b, whereby a cable-receiving space 5 is formed at a first side edge 6 of circuit board assembly 3.

Figure 2A:
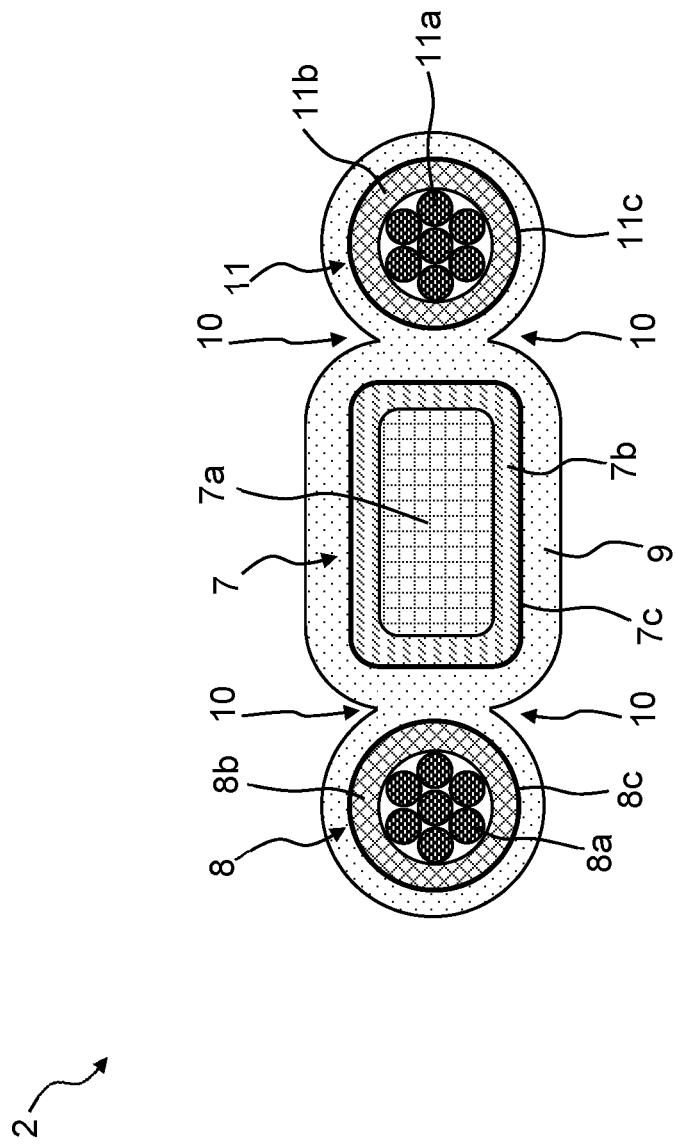
FIGS. 2A, 2B, 3 show different views of a hybrid cable assembly.
Figure 2B:
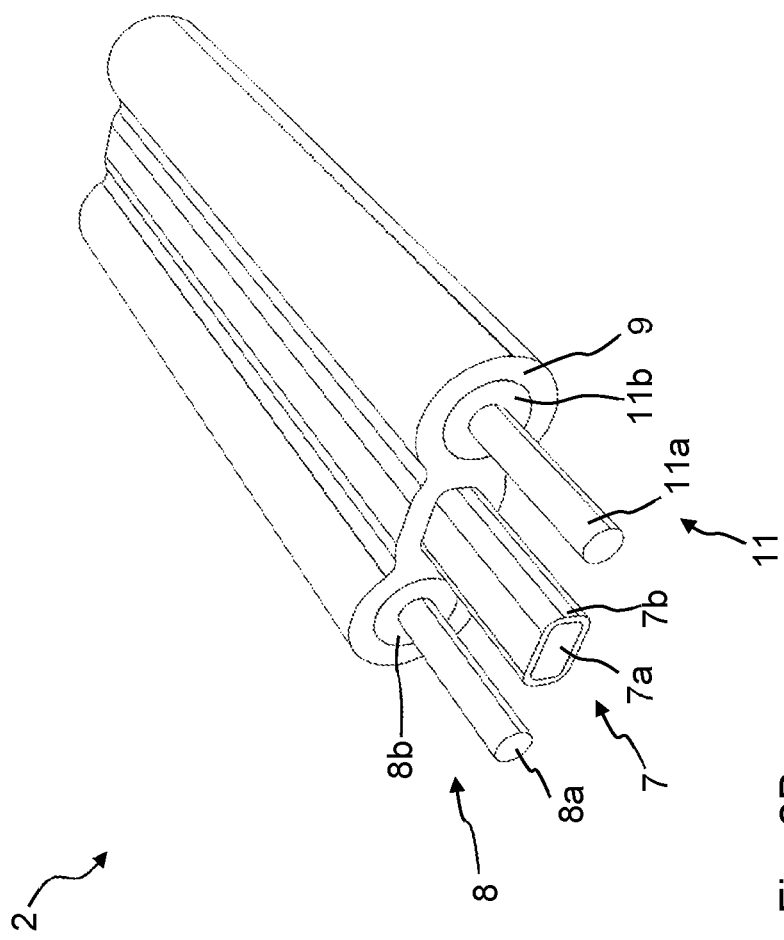

Hybrid cable assembly 2 of FIG. 1 is illustrated in greater detail in FIGS. 2A and 2B. Hybrid cable assembly 2 includes at least one dielectric waveguide system 7 having a core 7a surrounded by a cladding 7b. Both core 7a and cladding 7b are made of a dielectric material. The dielectric conductivity (dielectric constant) of the material of core 7a is higher than the dielectric conductivity (dielectric constant) of the material of cladding 7b, the materials or dielectric constants being selected relative to one another such that electromagnetic radiation in the frequency range from about 70 to no more than about 300 GHz, in particular in the frequency range from about 80 to about 150 GHz, is totally reflected at the interface between core 7a and surrounding cladding 7b, the interface extending perpendicular to the plane of paper. In this exemplary embodiment, cladding 7b is surrounded by a shielding film 7c. This shielding film 7c is made of a non-conductive material (e.g., plastic, in particular polyethylene terephthalate (PET)) having an electrically conductive metal provided, in particular vapor-deposited, on the outside and/or inside thereof. The metal is in particular aluminum. In addition or as an alternative to shielding film 7c, a shielding braid could be disposed around cladding 7b.

Hybrid cable assembly 2 includes a first conductor system 8. First conductor system 8 includes an electrically conductive inner conductor assembly 8a, which is preferably composed of one wire or a plurality of strands (in this case seven strands), which strands may be twisted together. Electrically conductive inner conductor assembly 8a is surrounded by a sheath 8b, which, in turn, is surrounded by a shielding film 8c, which may be identical in design to shielding film 7c of dielectric waveguide system 7. In addition or as an alternative to shielding film 8c, a shielding braid may be provided. Sheath 8b is made from an electrically non-conductive material. If first conductor system 8 is configured as a coaxial cable for data transmission, then sheath 8b is made of a dielectric material.

Preferably, dielectric waveguide system 7 and first conductor system 8 are surrounded by a common electrically non-conductive insulating outer jacket 9. This outer jacket is also locally present between the at least one waveguide system 7 and first conductor assembly 8. Electrically non-conductive outer jacket 9 includes an indentation 10 in the region between waveguide system 7 and first conductor assembly 8 to facilitate separation of hybrid cable assembly 2.

FIG. 2A further shows a second conductor system 11, which includes an electrically conductive inner conductor assembly 11a surrounded by a sheath 11b and a shielding film 11c.

Core 7a of dielectric waveguide system 7 preferably has a rectangular outer contour in cross section. The ratio between the long side and the short side should preferably be 2:1, with deviations of preferably less than 20%, 15%, 10% or less than 5% being permissible. Electrically conductive inner conductor assembly 8a preferably has a round cross section or a cross-sectional contour that is approximated to such a round shape.

In FIG. 2B, the common electrically non-conductive outer jacket 9 is partially removed from one end of hybrid cable assembly 2. The same applies to the sheaths 8b, 11b of first and second conductor systems 8, 11.

At least the core 7a of the at least one dielectric waveguide system 7 is inserted at first side edge 6 into cable-receiving space 5. It is disposed at or coupled to a waveguide connection region 30 of circuit board assembly 3.

FIG. 1 further shows a computer chip 15, which is configured to communicate via the at least one dielectric waveguide system 7. Computer chip 15 is disposed on first outer layer assembly 3a. Preferably, however, it is disposed within circuit board assembly 3. In this regard, reference is made to FIG. 4D.

A resonant cavity 16 is provided between computer chip 15 and waveguide system 7. For this purpose, circuit board assembly 3 includes a second hollow between first and second outer layer assemblies 3a, 3b, which second hollow forms the resonant cavity 16. Reference is made to FIGS. 4A, 4B, 4C and 4D. A radiating surface 17 is disposed at a first end 16a of resonant cavity 16, the radiating surface extending over a portion of the length of resonant cavity 16. Moreover, radiating surface 17 is connected to a terminal of computer chip 15. Second end 16b of resonant cavity 16 is connected to cable-receiving space 5 via a passageway 18. This passageway 18 also forms the waveguide connection region 30. Resonant cavity 16 connects waveguide system 7 to computer chip 15 in the sense that electromagnetic radiation emerging from waveguide system 7 passes through resonant cavity 16 and strikes computer chip 15.

Resonant cavity 16 increases in size from first end 16*a* toward second end 16*b*. Resonant cavity 16 is bounded upwardly at least by electrically conductive layer 4*a* of first outer layer assembly 3*a* and downwardly at least by electrically conductive layer 4*b* of second outer layer assembly 3*b*. It is bounded by a first row of vias 19*a* toward the first side and by a second row of vias 19*b* toward the second side. Preferably, the vias extend through the entire circuit board assembly 3 and, in particular, are galvanically connected to the electrically conductive layers 4*a*, 4*b* of first and second outer layer assemblies 3*a*, 3*b*. They are immediately spaced apart in relation to the frequency, with a distance between two vias being less than $\lambda/2$ of the radar wave. A distance between the vias 19*a* of the first row and the vias 19*b* of the second row increases continuously from first end 16*a* toward second end 16*b* so that a boundary known as "horn" is formed when looking at the resonant cavity 16 in top view, so that circuit board assembly 3 has a horn-shaped resonant cavity 16. The horn-shaped configuration of resonant cavity 16 causes the electromagnetic radiation to be laterally focused in resonant cavity 16 toward computer chip 15.

In the exemplary embodiment, resonant cavity 16 is shown as a hollow space that is bounded at the top and bottom by electrically conductive layers 4*a*, 4*b* of outer layer assemblies 3*a*, 3*b* of circuit board assembly 3 and laterally by the two rows of vias 19A, 19*b*. In a modification of the exemplary embodiment shown, resonant cavity 16 may not be hollow, but filled with a dielectric material; a material suitable for filling resonant cavity 16 being in particular a material corresponding to the material of core 7*a* of dielectric waveguide system 7. Alternatively, a plastic material, such as polyethylene (PE) or polypropylene (PP), may be used as a material for filling the resonant cavity. The above-mentioned materials for filling resonant cavity 16 may preferably be incorporated in foamed form in resonant cavity 16.

Figure 4A:
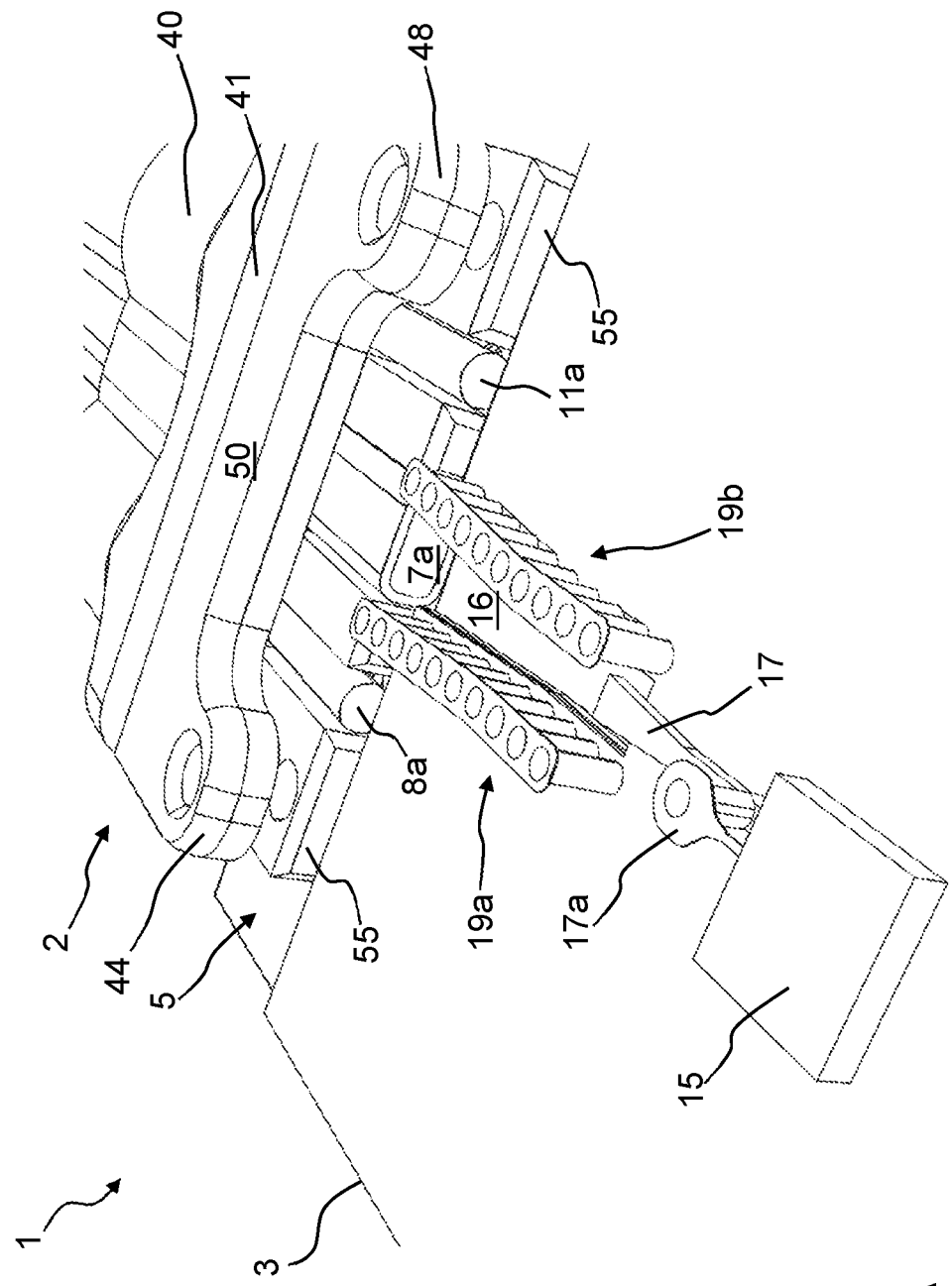
FIGS. 4A, 4B, 4C show different views of a circuit board assembly.
Figure 4B:
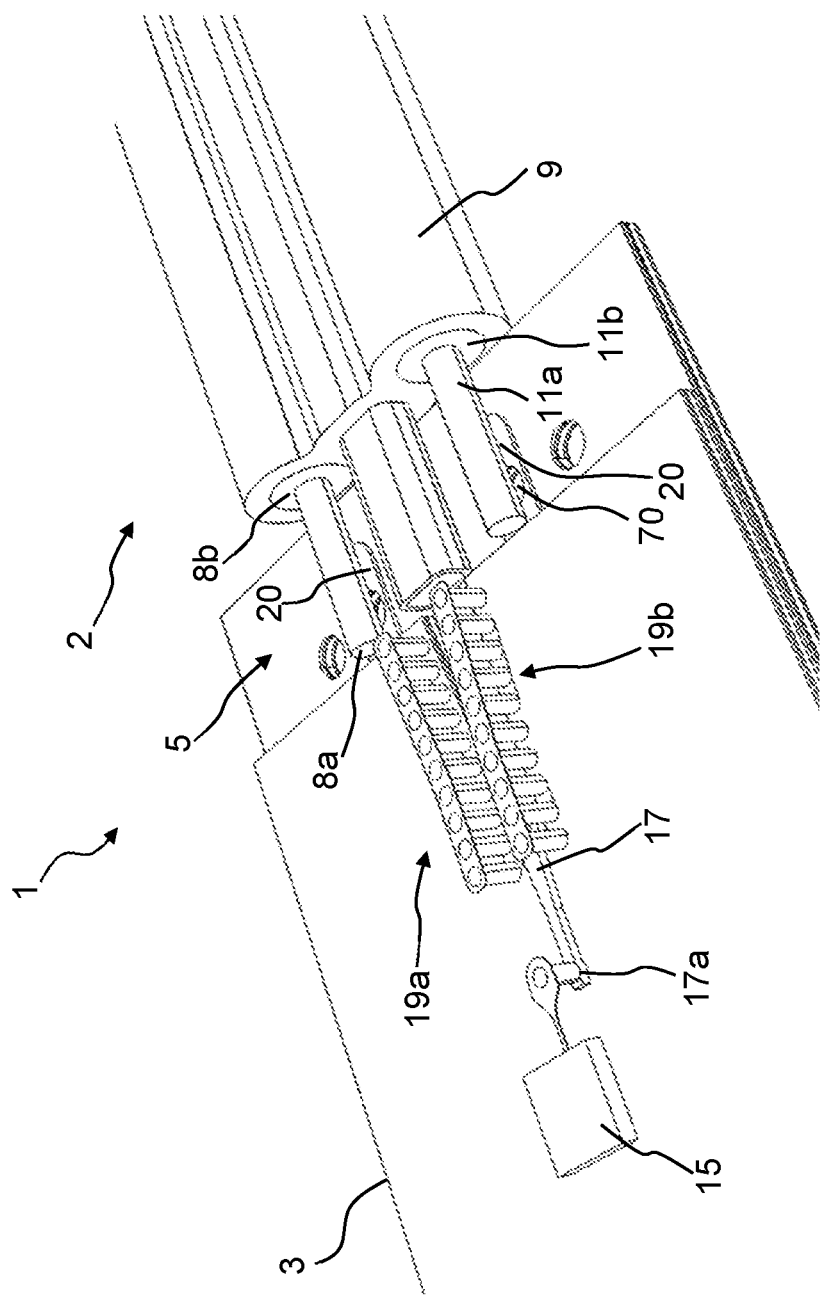
Figure 4C:
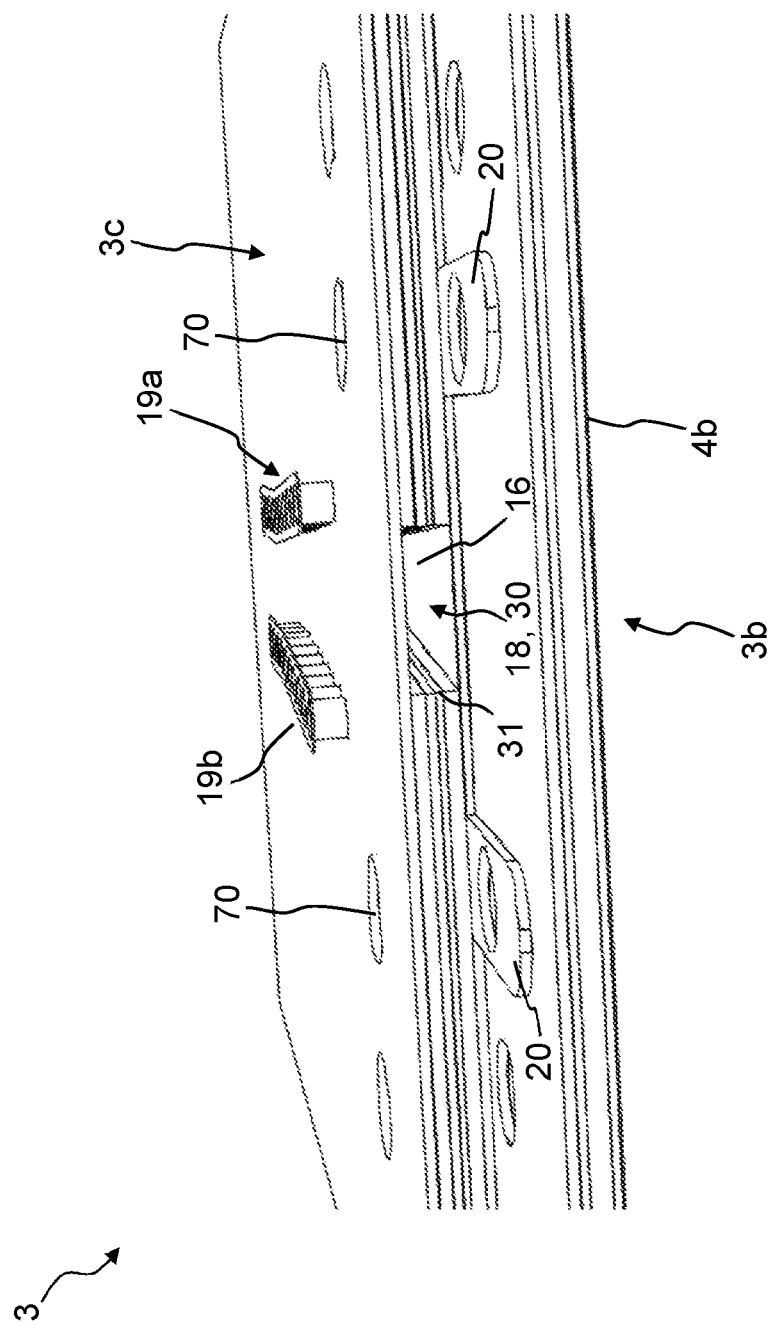
Figure 4D:
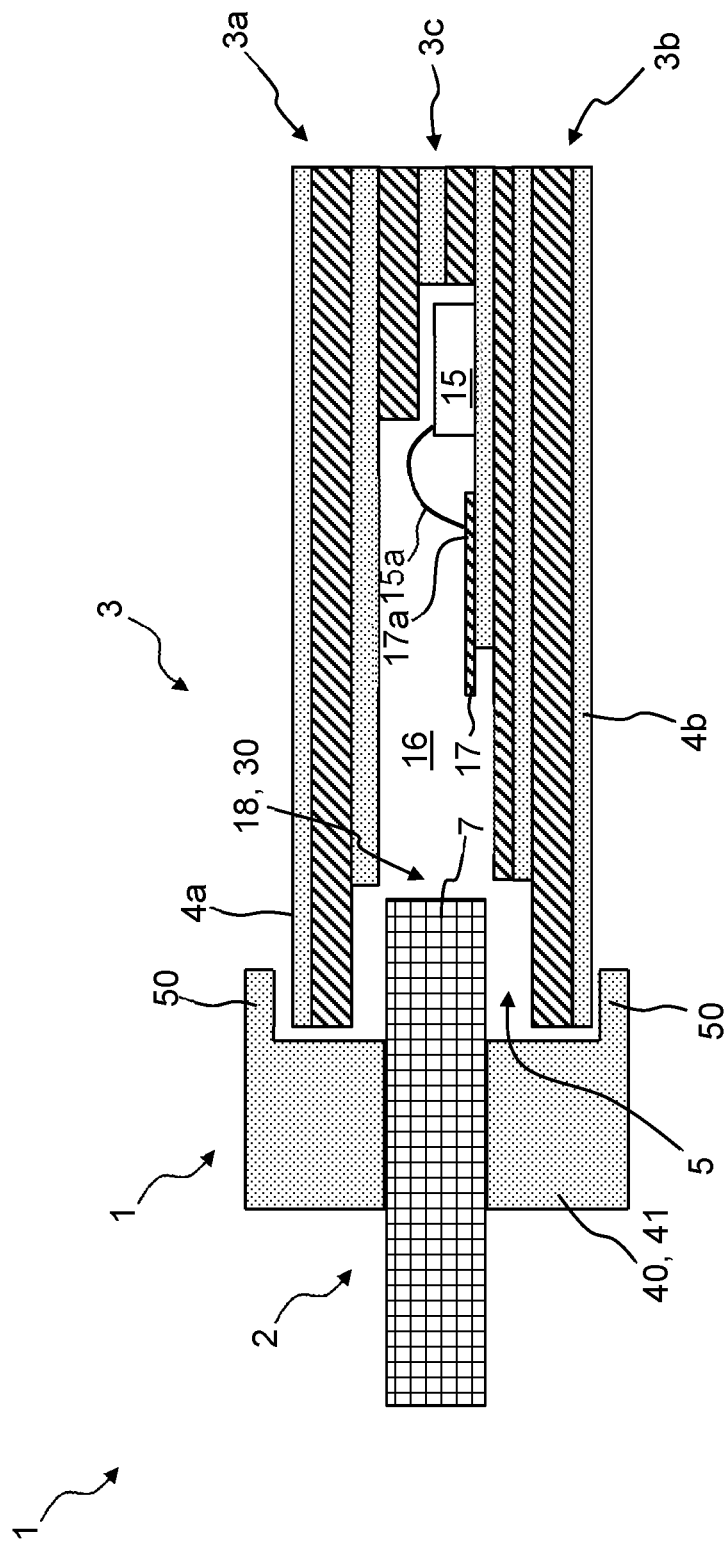
FIGS. 4D, 5A, 5B show different longitudinal sectional views through the inventive interconnection.

In FIG. 4D, computer chip 15 is shown disposed in resonant cavity 16. Preferably, computer chip 15 is disposed within circuit board assembly 3 without a housing. A terminal of computer chip 15 is connected via bond wires 15*a* to a contacting surface 17*a*, which is in particular galvanically connected to radiating surface 17 or forms part thereof.

Computer chip 15 could also be disposed in a separate receiving space formed by a third hollow within circuit board assembly 3. Circuit board assembly 3 is preferably manufactured in two halves. One half is provided with computer chip 15, whereupon the two halves are stacked upon one another and screwed and/or glued and/or pressed together.

In FIGS. 4A, 4B and 4C, at least the first outer layer assembly 3*a* is removed. Therefore, the first and second rows of vias 19A, 19*b* jut out.

Core 7*a* of dielectric waveguide system 7 may project into resonant cavity 16 and extend through a boundary wall 31 of resonant cavity 16 inwardly into resonant cavity 16. Preferably, core 7*a* of dielectric waveguide system 7 does not extend through boundary wall 31 of resonant cavity 16, but terminates at a distance from this boundary wall 31, in particular at a distance of more than 1 mm, 2 mm, 3 mm, but preferably of less than 10 mm, 7 mm, 5 mm, 3 mm. It is preferred in this connection that the end of core 7*a* of dielectric waveguide system 7 lie adjacent the second end 16*b* of resonant cavity 16 substantially flush therewith, with an offset of no more than about 1 to 10 mm, in particular no more than about 1 to 3 mm.

FIGS. 6A, 6B, 6C, 6D and 6E illustrate how hybrid cable assembly 2 may be attached to circuit board assembly 3. In this connection, reference is also made to FIGS. 1 and 3.

Hybrid cable assembly 2 includes a cable-collecting and aligning device 40 which is made of a plastic material or includes a plastic part. Cable-collecting and aligning device 40 has a main body 41. Cable-collecting and aligning device 40 is immovably disposed on or molded onto the at least one dielectric waveguide system 7 and first and/or second conductor systems 8, 11. Cable-collecting and aligning device 40 includes a fastening device 42 formed on main body 41. Preferably, it projects from main body 41. Fastening device 42 is configured to secure cable-collecting and aligning device 40 to circuit board assembly 3 in such a manner that dielectric waveguide system 7 and first and/or second conductor systems 8, 11 are disposed in a fixed position in cable-receiving space 5.

In the exemplary embodiment shown in FIGS. 6A through 6C, fastening device 42 includes a first and a second snap-in tongue 44, 45. These originate from main body 41 at different locations. First snap-in tongue 44 extends in the direction of a top side of circuit board assembly 3, the top side being formed by surface 4*a* of first outer layer assembly 3*a*. Second snap-in tongue 45 extends in the direction of a bottom side of circuit board assembly 3, the bottom side being formed by a surface 4*b* of second outer layer assembly 3*b*.

FIG. 1 shows a permanent connection. In this case, pins 46 extend through first and second snap-in tongues 44, 45. These pins also extend through circuit board assembly 3. Preferably, these pins are pressed into place. FIGS. 6A through 6C as well as 6D and 6E show a releasable connection. In this case, first snap-in tongue 44 includes a latching projection 44*a* which engages a first end 47*a* of a first latch opening 47. Second snap-in tongue 45 includes a latching projection 45*a* that engages a second end 47*b* of first latch opening 47 at second outer layer assembly 3*b*. First latch opening 47 preferably extends completely through circuit board assembly 3 and is produced by a drilling process. First and second snap-in tongues 44, 45 overlap one another preferably partially, in particular completely, in a top view of main body 41. Preferably, there is also a third and a fourth snap-in tongue 48, 49, which are disposed at the other end of main body 41. A connecting web 50 is disposed between first and third snap-in tongues 44, 48. First and third snap-in tongues 44, 48 are preferably separated from connecting web 50 by a slit 51 so that they have resilient properties. The same applies also to second and fourth snap-in tongues 45, 49.

Connecting web 50 preferably rests against the top side of first outer layer assembly 3*a*. The same applies also to the connecting web 50 between second and fourth snap-in tongues 45, 49, which rests against the top side of second outer layer assembly 3*b*.

In principle, it would also be possible to provide only the first snap-in tongue 44 to form the releasable connection. First snap-in tongue 44 then rests against first or second outer layer assembly 3*a*, 3*b* and engages first latch opening 47. A holding element 66, which will be described later herein, then rests against the opposite second or first outer layer assembly 3*b*, 3*a*. Alternatively or additionally, the opposite connecting web 50 may extend further in the direction of circuit board assembly 3 so that circuit board assembly 3 is embraced.

Fastening device 42 includes at least one alignment tongue 55 which extends from main body 41 toward circuit board assembly 3 and terminates in cable-receiving space 5.

Figure 3:
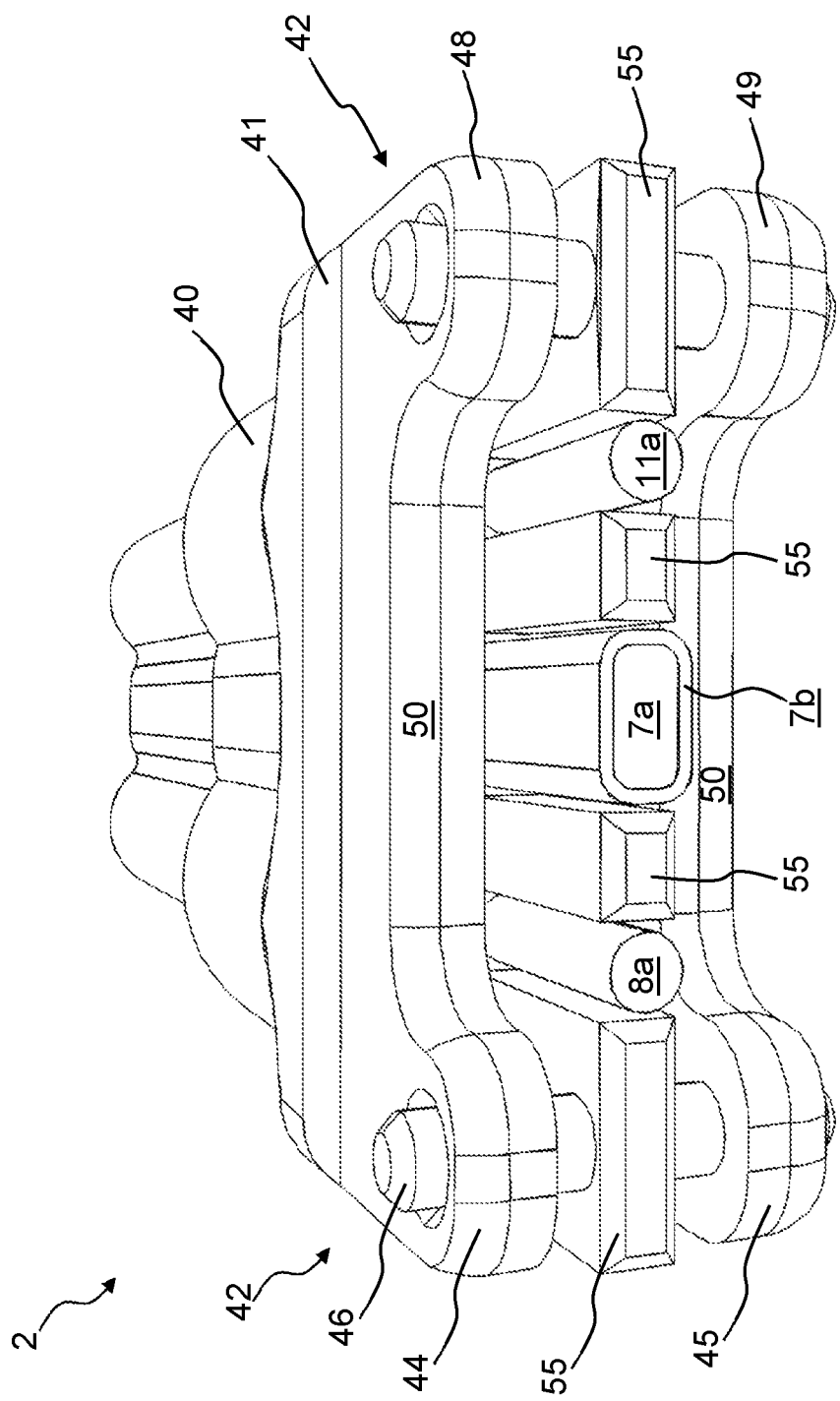

The at least one alignment tongue 55 is disposed between the at least one dielectric waveguide system 7 and first conductor system 8. In FIG. 3, there are a plurality of connecting webs 55, which are disposed on both sides between the respective first and second conductor systems 8, 11. They can differ in width. Preferably, alignment tongues 55 are tapered toward their free ends to facilitate the insertion of alignment tongues 55 into cable-receiving space 5.

Figure 6D:
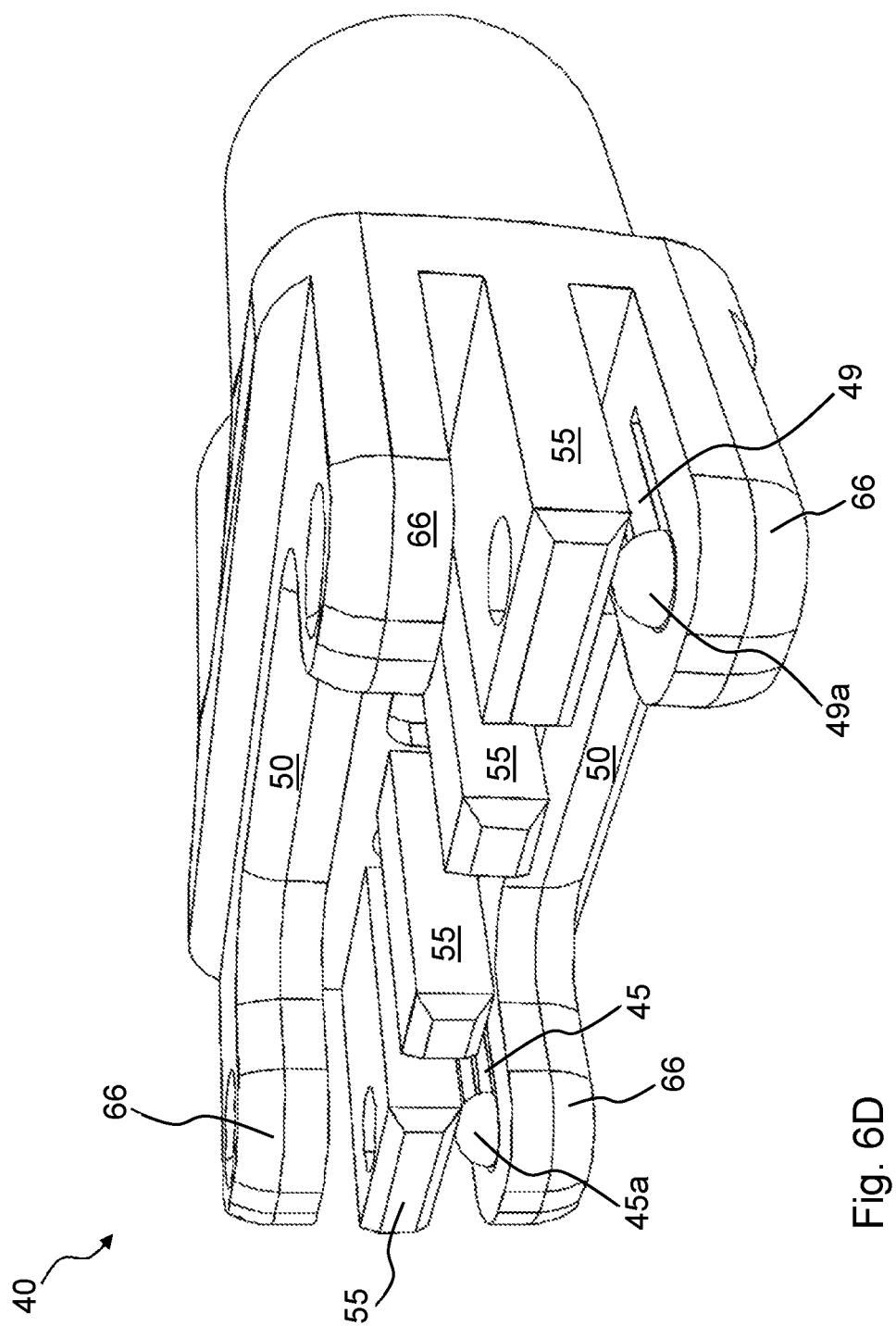
Figure 6E:
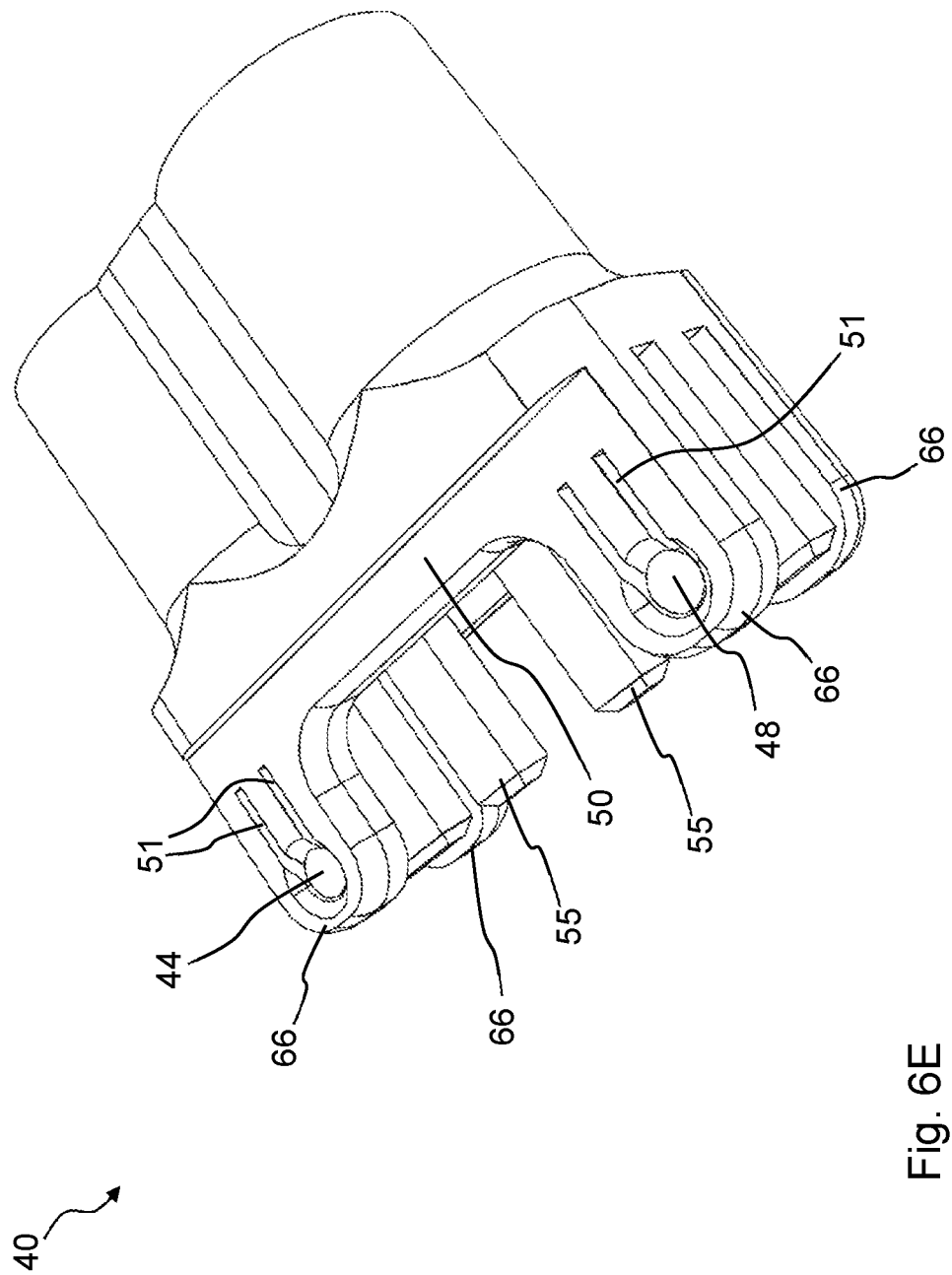

In another exemplary embodiment, illustrated in FIGS. 6D and 6E, snap-in tongues 44, 45, 48, 49 partially differ in construction. Fastening device 42 includes at least one first snap-in tongue 44. Again, the least one first snap-in tongue 44 originates from main body 41 and is resiliently formed thereon. In FIG. 6E, the at least one first snap-in tongue 44 extends in the direction of a top side of circuit board assembly 3, the top side being formed by a surface 4a of first outer layer assembly 3a. In FIG. 6D, the top side is formed by a surface 4b of second outer layer assembly 3b. At least one first latch opening 47 extends through circuit board assembly 3 (see FIG. 6B). First snap-in tongue 44 includes a latching projection 44a in the form of a latching ball, for example, which engages first latch opening 47. Fastening device 42 includes at least one first holding element 66 which originates from main body 41 and extends in the direction of a top side of circuit board assembly 3. The at least one first snap-in tongue 44 (FIG. 6E) is disposed in an opening of holding element 66 and surrounded by the at least one first holding element 66, with a slit 51 being formed partially around the at least one first snap-in tongue 44 between the at least one first snap-in tongue 44 and the at least one first holding element 66, whereby the at least one first snap-in tongue 44 is attached only to main body 41 and is movable relative to the at least one holding element 66. Holding element 66 allows application of force over an area, whereas the at least one snap-in tongue 44 provides for pull-off protection. FIGS. 6D and 6E differ in the positions at which snap-in tongues 44, 45, 48, 49 are disposed; i.e., whether they rest against the first or second outer layer assembly 3a 3b. Preferably, there are at least two snap-in tongues 44, 45, 48, 49. These are spaced apart and rest against different outer layer assemblies 3a, 3b. They may also rest against the same outer layer assembly 3a 3b and are then separated from each other by connecting web 50.

Cable-collecting and aligning device 40 is an injection-molded plastic part. The slits 51 between snap-in tongues 44, 45, 48, 49 and the respective holding elements 66 are formed by movable, sliding cores in the plastic injection-molding process, the length of slits 51 being freely selectable via the displacement of the sliding cores, which makes it possible to adjust the spring constant of snap-in tongues 44, 45, 49, 50.

In principle, it is also possible for fastening device 42 to be configured such that attachment of hybrid cable assembly 2 to circuit board assembly 3 is only possible in a specific alignment or angular position. For this purpose, alignment tongues 55 or first and/or second conductor systems 8, 11 or the respective snap-in tongues 44, 45, 48, 49 may have a keyed shape that corresponds to a correspondingly keyed mating shape in circuit board assembly 3 corresponds, whereby mechanical keying is provided.

Figure 5A:
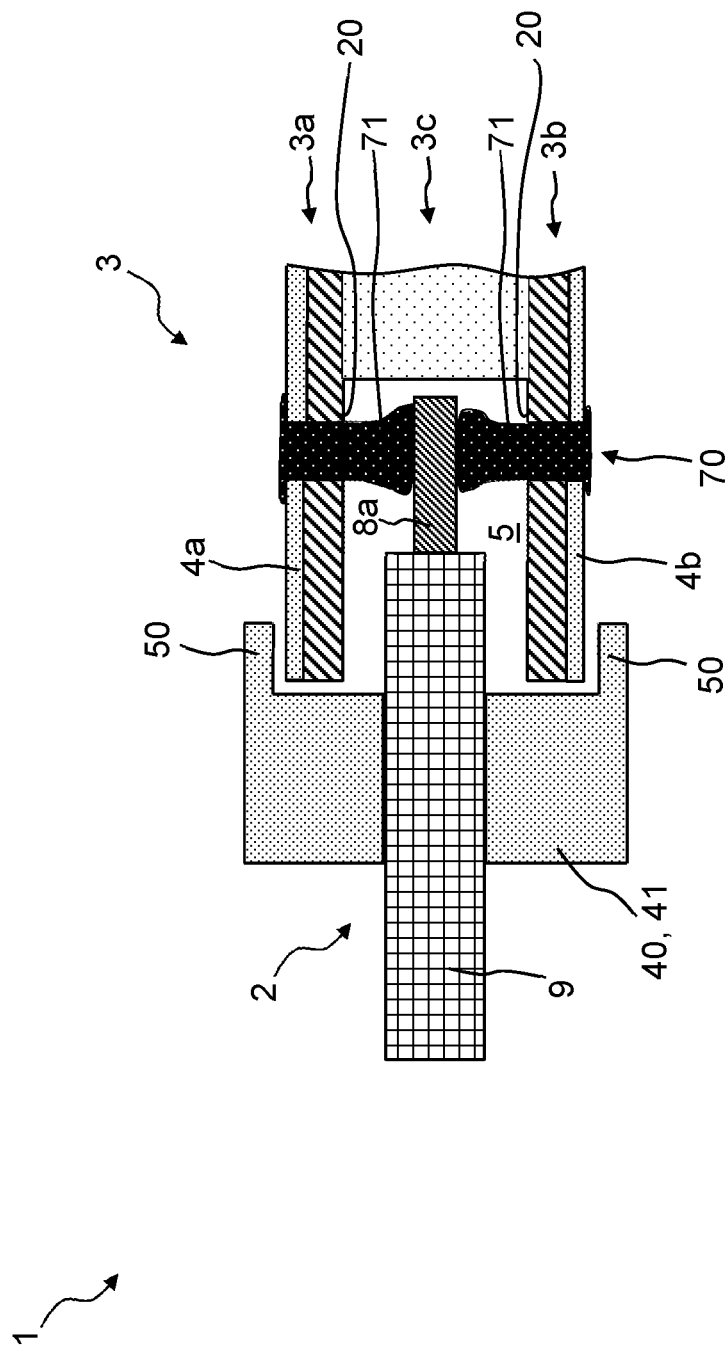
Figure 5B:
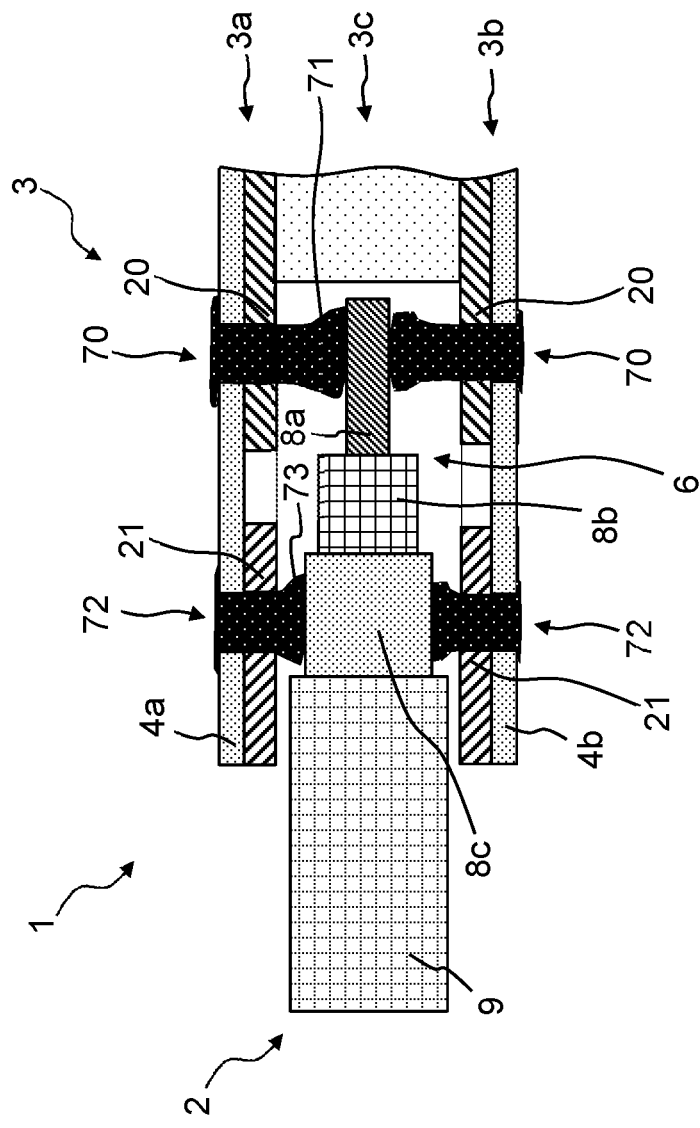

FIGS. 5A and 5B illustrate how first conductor system 8 is contacted to circuit board assembly 3. At least one first inner-conductor contact opening 70 is provided which extends through first and/or second outer layer assembly 3a, 3b and opens into cable-receiving space 5. First electrically conductive inner conductor assembly 8a of first conductor system 8 is inserted at first side edge 6 into cable-receiving space 5 and disposed below or above first inner-conductor contact opening 70. Electrically conductive inner conductor assembly 8a of first conductor system 8 is then electrically conductively attached, in particular soldered, to first inner-conductor connection region 20 of first and/or second outer layer assemblies 3a, 3b of circuit board assembly 3 via a soldered inner-conductor connection 71 at least in the region of first inner-conductor contact opening 70.

FIG. 5B shows a first outer-conductor contact opening 72 which, like first inner-conductor contact opening 70, is disposed in circuit board assembly 3, but is closer to first side edge 6 than first inner-conductor contact opening 70. The outer conductor assembly of first conductor system 8 is provided, in particular, by shielding film 8c or by the shielding braid, for example through suitable contacting or interconnection. The electrical contacting is then effected via a corresponding soldered outer-conductor connection 73.

The same would also apply to second conductor system 11 or any further conductor system.

FIGS. 7A, 7B, 7C, 7D and 7E show a first exemplary embodiment that allows inner conductor assembly 8a to be releasably connected to circuit board assembly 3. In this case, circuit board assembly 3 includes at least one spring element 80. Spring element 80 is disposed in a housing assembly 85 which rests on first or second outer layer assembly 3a 3b.

Figure 7D:
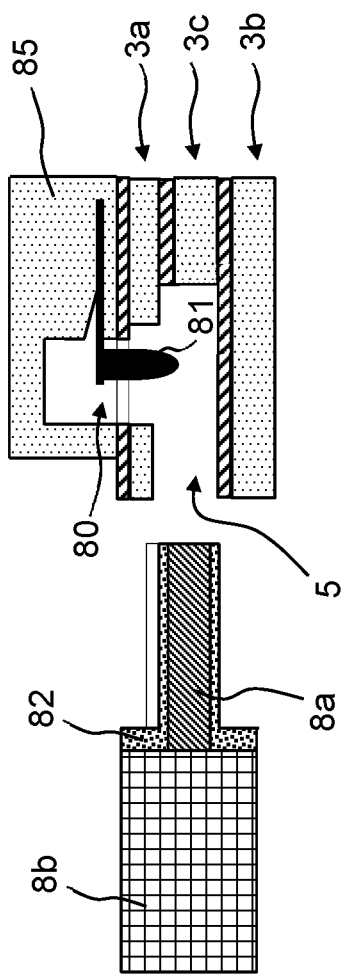
Figure 7E:
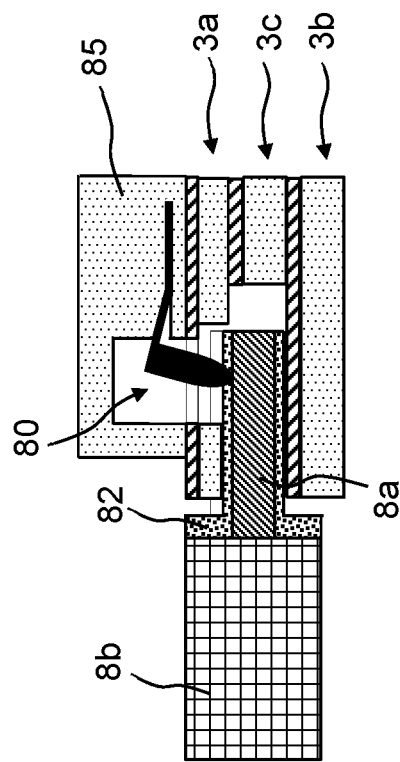

Spring element 80 has a contacting projection 81 extending from a side of spring element 80. Contacting projection 81 of spring element 80 enters through an opening in first or second outer layer assembly 3a, 3b into cable-receiving space 5. In a rest position (FIG. 7D) prior to insertion of electrically conductive inner conductor assembly 8a into cable-receiving space 5, contacting projection 81 is not in contact with electrically conductive inner conductor assembly 8a. In a contacting position (see FIG. 7E), which is obtained after insertion of electrically conductive inner conductor assembly 8a into cable-receiving space 5, contacting projection 81 comes into galvanic contact with electrically conductive inner conductor assembly 8a. In this case, spring element 80 is deflected and bent away from inner conductor assembly 8a. In FIGS. 7D and 7E, spring element 80 and contacting projection 81 are electrically conductive and preferably formed as a single piece. In this case, the electrical contacting of inner conductor assembly is effected via contacting projection 81 and spring element 80, which, in turn, is electrically connected to other elements of circuit board assembly 3.

Contacting projection 81 may directly contact inner conductor assembly 8a of first conductor system 8. Hybrid cable assembly 2 preferably includes also an inner conductor sleeve 82 which is pressed onto electrically conductive inner conductor assembly 8a of first conductor system 8 (see FIGS. 7A through 7C). Inner conductor sleeve 82 preferably has the shape of a wire end ferrule. The diameter of inner conductor sleeve 82 is larger at the end where inner conductor sleeve 82 rests against electric sheath 8b of first conductor system 8. Inner conductor sleeve 82 is trough-shaped or U-shaped in cross section (see FIGS. 7B, 7C), whereby a guide channel 83 for receiving contacting projection 81 is formed over at least a portion of the length of inner conductor sleeve 82 along its longitudinal axis.

Figure 8C:
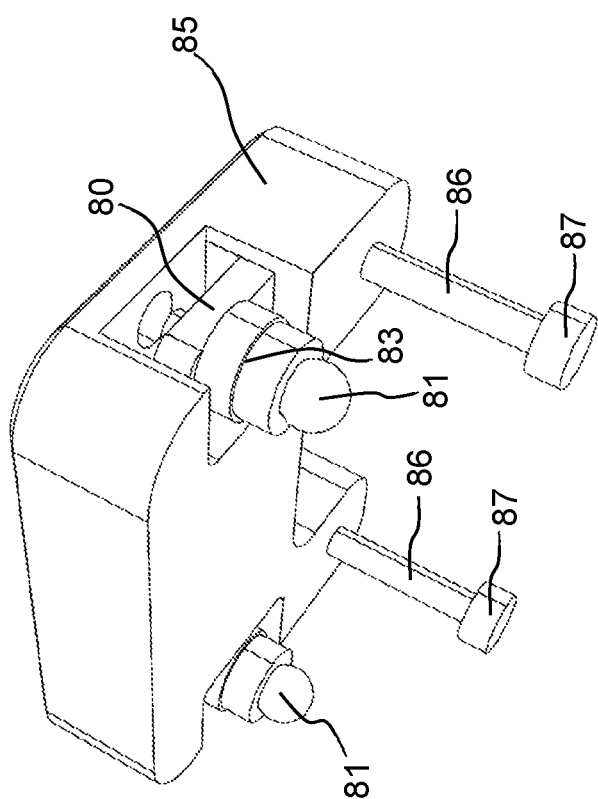

Another exemplary embodiment is illustrated in FIGS. 8A, 8B and 8C. Contacting projection 81 and spring element 80 are formed in two pieces, with contacting projection 81 having the shape of a contacting pin. The pin head, which contacts inner conductor assembly 8a, has a larger diameter than the pin neck. The contacting pin is preferably pressed into an opening of spring element 80 or rests against the same. Further provided is a sleeve 83 which is electrically conductive. Sleeve 83 is inserted in the opening in first or second outer layer assembly 3a, 3b. The inner wall of the opening is plated so that the sleeve 83 and the inner wall are in galvanic contact with each other. The contacting pin is galvanically connected to sleeve 83 and is movable therein. When the pin head moves toward sleeve 83, then the end of the pin neck presses against spring element 80, whereby spring element 80 exerts a force upon the contacting pin. In FIG. 8A, in which inner conductor assembly 8a is not inserted, spring element 80 pushes the pin head of the connecting pin out of sleeve 83. When inner conductor assembly 8a is inserted, it pushes the pin head of the connecting pin toward sleeve 83, thereby deflecting spring element 80. The electrical connection between inner conductor assembly 8a and circuit board 3 is then effected via the contacting pin and sleeve 83 and the plated inner wall of the opening. It would also be possible for sleeve 83 to be inserted in the opening instead of being permanently pressed thereinto. In this case, sleeve 83, the contacting pin, and spring element 80 are preferably pressed and/or welded together. When inserting inner conductor assembly 8a, sleeve 83 is partially moved out of the opening, but remains in contact with the inner wall of the opening. Sleeve 83 preferably has sections of different diameter, so that one section forms a flange-like margin whose diameter is larger than the diameter of the opening, which prevents sleeve 83 from falling through the opening. Sleeve 83, the contacting pin and spring element 80 are assembled together prior to installation. FIG. 8B shows the contacting position in a cross-sectional view through interconnection 1. FIG. 8C shows housing assembly 85 in an isolated view. Housing assembly 85 may be made of or include a plastic material. Preferably, housing assembly 85 is open only, or substantially only, toward the opening in the first or second outer layer assembly 3a 3b.

Housing assembly 85 may be attached to circuit board assembly 3 in a plastic injection-molding process. The (in particular one-piece) housing assembly 85 preferably includes at least one mounting pin 86 (see FIGS. 8B, 8C). Circuit board assembly 3 includes at least one mounting hole which extends completely through circuit board assembly 3. The at least one mounting pin 86 extends away from housing assembly 85 and through the at least one mounting hole of circuit board assembly 3. A free end of the at least one mounting pin 86 is curved and/or deformed so that after installation of housing assembly 85, mounting pin 86 can no longer be moved through the at least one mounting hole and housing assembly 85 can no longer be removed. The deformation may take place, in particular, in an ultrasonic welding process, whereby the free end of mounting pin 86 is deformed and increased in diameter.

For purposes of contacting the electrically conductive inner conductor assembly of second conductor system 11, circuit board assembly 3 includes a further spring element.

Figure 9:
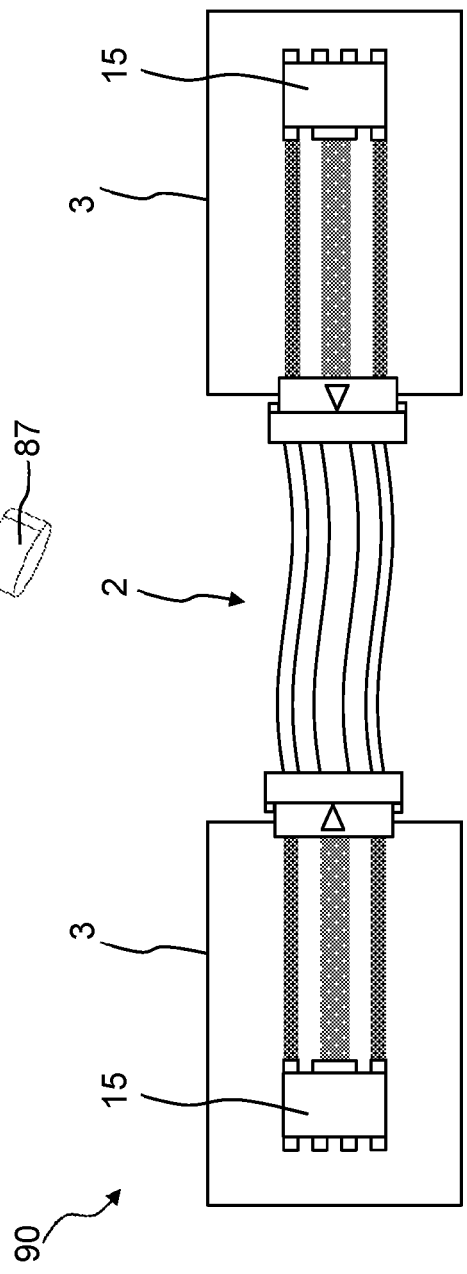
FIG. 9 is a view of a circuit board combination including two circuit board assemblies which are interconnected via a hybrid cable assembly.

FIG. 9 shows a circuit board combination 90. This circuit board combination 90 includes two interconnections 1, each interconnection 1 including a circuit board assembly 3 and hybrid cable assembly 2. Each circuit board assembly 3 is provided with a computer chip 15 thereon. The two computer chips 15 communicate with each other bi-directionally via dielectric waveguide system 7. Via first conductor system 8, a current is transmitted a from one circuit board assembly 3 to the other circuit board assembly 3 through hybrid cable assembly 2. The ground connection of one circuit board assembly 3 to the other circuit board assembly 3 is via second conductor system 11. As can be seen, by using the interconnection according to an embodiment of the invention, it is possible to create very compact connections between a circuit board assembly 3 and a hybrid cable 2.

In the following, several particularly advantageous embodiments of interconnection 1 will once again be pointed out separately.

Interconnection 1 preferably has the following feature:
radiating surface 17 is an electrically conductive layer 4d of intermediate layer assembly 3c or a separate metal part.

Interconnection 1 preferably has the following feature:
hollow 5 is formed in intermediate layer assembly 3c by a mechanical machining process; or
the first and second outer layer assemblies 3b, 3b project beyond intermediate layer assembly 3c at first side edge 6, thereby forming hollow 5 and thus cable connection space 5.

Interconnection 1 preferably has the following features:
first conductor system 8 of hybrid cable assembly 2 further includes an electrically conductive outer conductor assembly 8c which is galvanically isolated from inner conductor assembly 8a by sheath 8b;
at least one first outer-conductor contact opening 72 extends through first and/or second outer layer assembly 3a, 3b and opens into cable-receiving space 5;
first outer-conductor contact opening 72 is disposed closer to first side edge 6 than first inner-conductor contact opening 70;
outer conductor assembly 8c of first conductor system 8 is inserted at first side edge 6 into cable-receiving space 5 and disposed above or below outer-conductor contact opening 72.
outer conductor assembly 8c of first conductor system 8 is electrically conductively soldered via a first soldered outer-conductor connection 73 to a first outer-conductor connection region 21 of first and/or second outer layer assemblies 3a, 3b, at least in the region of the first outer-conductor contact opening 72;
first inner-conductor connection region 20 is galvanically isolated from first outer-conductor connection region 21.

Interconnection 1 preferably has the following features:
hybrid cable assembly 2 includes a second conductor system 11 for power and/or data transmission;
second conductor system 11 includes an electrically conductive inner conductor assembly 11a surrounded by a sheath 11b;
first and second conductor systems 8, 11 and dielectric waveguide system 7 are arranged parallel to each other;
at least one second inner-conductor contact opening extends through first and/or second outer layer assembly 3a, 3b and opens into cable-receiving space 5;
electrically conductive inner conductor assembly 11a of second conductor system 11 is inserted at first side edge 6 into cable-receiving space 5 and disposed below or above the at least one second inner-conductor contact opening;
electrically conductive inner conductor assembly 11a of second conductor system 11 is electrically conductively soldered to a second inner-conductor connection region of first and/or second outer layer assemblies 3a, 3b via a second soldered inner-conductor connection at least in the region of the second inner-conductor contact opening;
the first inner-conductor connection region and the second inner-conductor connection region are galvanically isolated from each other.

The explanations given with respect to electrically conductive outer conductor assembly 8c of first conductor system 8 apply equally to electrically conductive outer conductor assembly 11c of second conductor system 11.

Interconnection 1 preferably has the following features:
outer conductor assembly 8c of first conductor system 8 includes a shielding braid and/or a shielding film; and/or
inner conductor assembly 8a of first conductor system 8 includes a plurality of strands or one wire.

Interconnection 1 preferably has the following features:
one end of the pin-shaped contacting projection 81 has a pin head which is larger in diameter than an adjoining pin neck and is in contact with a first side of sleeve 83; and/or
a pin neck of pin-shaped contacting projection 81 extends through both sleeve 83 and spring element 80 via a corresponding opening.

Interconnection 1 preferably has the following feature:
one end of the pin neck of contacting projection 81 is pressed together with sleeve 83 and spring element 80.

Interconnection 1 preferably has the following features:
sleeve 83 includes a flange-like margin which is larger in diameter than the opening in first or second outer layer assembly 3a, 3b, which prevents sleeve 83 from falling through the opening; and/or
an inner wall of the opening in first or second outer layer assembly 3a, 3b is plated, whereby sleeve 83 is in galvanic contact with the inner wall; and/or
sleeve 83 is fitted into the opening and movably guided therein, whereby, in the contacting position, sleeve 83 protrudes from the opening toward housing assembly 85 further than in the rest position.

Interconnection 1 preferably has the following additional feature:
at least one further spring element 80 is disposed in housing assembly 85.

Interconnection 1 preferably has the following additional features:
fastening device 42 includes at least one second snap-in tongue 45;
second snap-in tongue 45 extends in the direction of a top side of circuit board assembly 3, the top side being formed by a surface 4a, 4b of first or second outer layer assembly 3a, 3b;
second snap-in tongue 45 includes a latching projection 45a that engages first latch opening 47 via the other surface 4a, 4b, or the latching projection engages a second latch opening which is disposed in circuit board assembly 3 at an offset from first latch opening 47.

Interconnection 1 preferably has the following feature:
the sheaths 8b, 11b of at least two or all of the wire systems 8, 11 differ in color.

Interconnection 1 preferably has the following feature:
an electrically non-conductive outer jacket 9 is provided which surrounds both the at least one dielectric waveguide system 7 and first conductor system 8 and/or second conductor system 11 together.

Interconnection 1 preferably has the following feature:
resonant cavity 16 is filled with a dielectric material, the material used for filling:
a) corresponding to the material of core 7a of dielectric waveguide system 7; and/or
b) being a plastic such as polyethylene (PE) or polypropylene (PP).

Interconnection 1 preferably has the following feature:
the material used for filling resonant cavity 16 is a foam material.

While embodiments of the invention have been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. An interconnection comprising: a circuit board assembly including a first outer layer assembly, a second outer layer assembly, and an intermediate layer assembly which are stacked on top of each other, the intermediate layer assembly being disposed between the first outer layer assembly and the second outer layer assembly, the first outer layer assembly including at least one layer that is electrically conductive, the second outer layer assembly including at least one layer that is electrically conductive, and the circuit board assembly including a first hollow forming a cable-receiving space between the first outer layer assembly and the second outer layer assembly, whereby the cable-receiving space is formed at a first side edge of the circuit board assembly, and a second hollow between the first outer layer assembly and the second outer layer assembly, whereby a resonant cavity is formed; and a hybrid cable assembly including at least one dielectric waveguide system configured to transmit a radar wave in a frequency range from about 70 to about 300 GHz, the at least one dielectric waveguide system having a core and a cladding, the cladding surrounding the core, the hybrid cable assembly including a first conductor system configured to transmit power and/or data, the first conductor system being disposed adjacent to the at least one dielectric waveguide system, the first conductor system including an electrically conductive inner conductor assembly surrounded by a sheath, the electrically conductive inner conductor assembly being inserted at the first side edge into the cable-receiving space and galvanically connected to a first inner-conductor connection region of the circuit board assembly, and at least the core of the at least one dielectric waveguide system being inserted at the first side edge into the cable-receiving space and disposed at a waveguide connection region of the circuit board assembly, wherein the circuit board assembly includes a computer chip which is configured to communicate via the at least one dielectric waveguide system, and wherein the resonant cavity connects the at least one dielectric waveguide system to the computer chip such that electromagnetic radiation emerging from the at least one dielectric waveguide system passes through the resonant cavity and strikes the computer chip.

2. The interconnection as recited in claim 1, wherein:
the resonant cavity increases in size from the first end toward the second end;
the resonant cavity is bounded upwardly at least by the electrically conductive layer of the first outer layer assembly;
the resonant cavity is bounded downwardly at least by the electrically conductive layer of the second outer layer assembly;
the resonant cavity is bounded toward a first and a second side by a first row of vias and by a second row of vias, the vias being galvanically connected to the electrically conductive layers of the first and second outer layer assemblies; and
the computer chip is disposed within the circuit board assembly.

3. The interconnection as recited in claim 2, wherein:
a radiating surface is disposed at a first end of the resonant cavity and extends into the resonant cavity and is connected to the computer chip, a second end of the resonant cavity having a passageway to the cable-receiving space, whereby the waveguide connection region is formed; and
the core of the at least one dielectric waveguide system is disposed in a region of the passageway.

4. The interconnection as recited in claim 3, wherein the computer chip is disposed within the circuit board assembly without a housing, and wherein bond wires connect a terminal of the computer chip to a contacting surface of the circuit board assembly, the contacting surface being galvanically connected to the radiating surface.

5. The interconnection as recited in claim 2, wherein:
the computer chip is disposed in the resonant cavity; or
the circuit board assembly includes a third hollow between the first outer layer assembly and the second outer layer assembly, whereby a receiving space is formed, the computer chip being disposed in the receiving space.

6. The interconnection as recited in claim 1, wherein:
at least one first inner-conductor contact opening extends through the first outer layer assembly and/or the second layer assembly layer and opens into the cable-receiving space;
the electrically conductive inner conductor assembly of the first conductor system is inserted at the first side edge into the cable-receiving space and disposed below or above the first inner-conductor contact opening; and
the electrically conductive inner conductor assembly of the first conductor system is electrically conductively soldered to the first inner-conductor connection region of the first and/or second outer layer assemblies of the circuit board assembly via a first soldered inner-conductor connection at least in a region of the first inner-conductor contact opening.

7. The interconnection as recited in claim 1, wherein:
the circuit board assembly includes at least one housing assembly having at least one spring element disposed therein;
the housing assembly rests on the first or second outer layer assembly;
the spring element has a contacting projection extending from a side of the spring element;
the contacting projection of the spring element enters through an opening in the first or second outer layer assembly into the cable-receiving space;
in a rest position prior to insertion of the electrically conductive inner conductor assembly into the cable-receiving space, the contacting projection is not in contact with the electrically conductive inner conductor assembly of the first conductor system; and
in a contacting position upon insertion of the electrically conductive inner conductor assembly into the cable-receiving space, the contacting projection comes into galvanic contact with the electrically conductive inner conductor assembly of the first conductor system, and the spring element is deflected and bent away from the electrically conductive inner conductor assembly of the first conductor system.

8. The interconnection as recited in claim 7, wherein:
the spring element is electrically conductive, the contacting projection and the spring element are formed as a single piece, and the contacting projection is formed into the spring element by deep stamping; or
the contacting projection and the spring element are formed in two pieces, and the contacting projection is configured as a contacting pin, wherein the contacting pin is:
pressed into an opening of the spring element; and/or
disposed in a sleeve, the sleeve being inserted in the opening in the first or second outer layer assembly, the sleeve being galvanically connected to an electrically conductive layer of the first or second outer layer assembly, the contacting pin being galvanically connected to the sleeve, and the contacting pin pressing against the spring element when in the contacting position, whereby the spring element is bent away from the electrically conductive inner conductor assembly of the first conductor system.

9. The interconnection as recited in claim 7, wherein:
the hybrid cable assembly includes an inner conductor sleeve which is pressed onto the electrically conductive inner conductor assembly of the first conductor system;
the inner conductor sleeve is trough-shaped or U-shaped in cross section, whereby a guide channel for receiving the contacting projection is formed over at least a portion of the length of the inner conductor sleeve along its longitudinal axis; and
the contacting projection moves in and along the guide channel of the inner conductor sleeve as the hybrid cable assembly is inserted.

10. The interconnection as recited in claim 7, wherein:
the housing assembly includes at least one mounting pin, the circuit board assembly includes at least one mounting hole which extends completely through the circuit board assembly, the at least one mounting pin extends away from the housing assembly and through the at least one mounting hole of the circuit board assembly, and a free end of the at least one mounting pin is curved and/or deformed so that the mounting pin can no longer be moved through the at least one mounting hole, whereby the housing assembly is secured to the circuit board assembly; or
the circuit board assembly is overmolded with the housing assembly, whereby the housing assembly is secured to the circuit board assembly.

11. The interconnection as recited in claim 1, wherein:
the hybrid cable assembly includes a cable-collecting and aligning device which is made of or includes a plastic material and has a main body;
the cable-collecting and aligning device is immovably disposed on the at least one dielectric waveguide system and the first conductor system;
the cable-collecting and aligning device includes at least one fastening device formed on the main body;
the fastening device is configured to secure the cable-collecting and aligning device to the circuit board assembly in such a manner that the dielectric waveguide system and the first conductor system are disposed in a fixed position in the cable-receiving space;
the fastening device includes at least one first snap-in tongue;
the least one first snap-in tongue originates from the main body and is resiliently formed thereon;
the at least one first second snap-in tongue extends in the direction of a top side of the circuit board assembly, the top side being formed by a surface of the first or second outer layer assembly;
a first latch opening extends through the circuit board assembly; and
the first snap-in tongue includes a latching projection which engages the first latch opening.

12. The interconnection as recited in claim 11, wherein:
the fastening device includes at least one first holding element which originates from the main body and extends in the direction of the top side of the circuit board assembly; and
the at least one first snap-in tongue is disposed in an opening of the holding element and surrounded by the at least one first holding element with a slit being formed partially around the at least one first snap-in tongue between the at least one first snap-in tongue and the at least one first holding element, whereby the at least one first snap-in tongue is attached only to main body and is movable relative to the at least one holding element.

13. The interconnection as recited in claim 11, wherein:
the main body has at least one alignment tongue formed thereon which extends from the main body toward the circuit board assembly and terminates in the cable-receiving space; and
the at least one alignment tongue is disposed between the at least one dielectric waveguide system and the first conductor system.

14. The interconnection according to claim 1, wherein the at least one dielectric waveguide system is configured to transmit the radar wave in a frequency range from about 80 to about 150 GHz.

\* \* \* \* \*